US007945829B2

(12) United States Patent
Nanba et al.

(10) Patent No.: US 7,945,829 B2
(45) Date of Patent: May 17, 2011

(54) SEMICONDUCTOR INTEGRATED CIRCUIT

(75) Inventors: Kazuteru Nanba, Chiba (JP); Hideo Ito, Chiba (JP)

(73) Assignee: National University Corporation Chiba University, Chiba (JP)

(*) Notice: Subject to any disclaimer, the term of this patent is extended or adjusted under 35 U.S.C. 154(b) by 587 days.

(21) Appl. No.: 11/795,842

(22) PCT Filed: Jan. 5, 2006

(86) PCT No.: PCT/JP2006/000022
§ 371 (c)(1),
(2), (4) Date: Apr. 9, 2008

(87) PCT Pub. No.: WO2006/077746
PCT Pub. Date: Jul. 27, 2006

(65) Prior Publication Data
US 2009/0102531 A1    Apr. 23, 2009

(30) Foreign Application Priority Data
Jan. 19, 2005 (JP) .................................. 2005-012119

(51) Int. Cl.
*G01R 31/28* (2006.01)
(52) U.S. Cl. ..................... 714/726; 714/727; 714/729
(58) Field of Classification Search ........... 714/726–731
See application file for complete search history.

(56) References Cited

U.S. PATENT DOCUMENTS

| 4,602,210 | A | * | 7/1986 | Fasang et al. | 714/731 |
| 5,596,584 | A | * | 1/1997 | Warren | 714/726 |
| 6,032,278 | A | * | 2/2000 | Parvathala et al. | 714/726 |
| 6,122,762 | A | * | 9/2000 | Kim | 714/726 |
| 6,271,700 | B1 | * | 8/2001 | Itaya | 327/202 |
| 6,388,465 | B1 | * | 5/2002 | Barbier et al. | 326/40 |
| 7,274,235 | B2 | * | 9/2007 | Nicolaidis | 327/225 |
| 7,308,626 | B2 | * | 12/2007 | Motika et al. | 714/724 |
| 7,568,141 | B2 | * | 7/2009 | Menon et al. | 714/727 |

FOREIGN PATENT DOCUMENTS

| JP | 2699355 B2 | 9/1997 |
| JP | 2003-255025 | 9/2003 |

OTHER PUBLICATIONS

Bulent I. Dervisouglu et al., "Design for testability: using scanpath techniques for path-delay test and measurement" Proceedings of International of International Test Conference, Oct. 1991, pp. 365-374.
International Search Report issued in International Application No. PCT/JP2006/300022 on Mar. 20, 2006.

* cited by examiner

*Primary Examiner* — Jeffrey A Gaffin
*Assistant Examiner* — Steve Nguyen
(74) *Attorney, Agent, or Firm* — Knobbe Martens Olson & Bear LLP

(57) ABSTRACT

[PROBLEMS] To provide a semiconductor integrated circuit by which what has been referred to as two-pattern test is made possible without greatly increasing an occupying area. [MEANS FOR SOLVING PROBLEMS] The semiconductor integrated circuit is provided with a plurality of flip-flop circuits and selectors corresponding to each flip-flop circuit. Each flip-flop circuit is provided with a master latch and a slave latch connected to the master latch. The selector is electrically connected with the master latch of the flip-flop circuit to which the selector corresponds, and is also connected with the master latch of the flip-flop circuit other than the one to which the selector corresponds.

6 Claims, 9 Drawing Sheets

SEMICONDUCTOR INTEGRATED CIRCUIT

Related Applications

The present application is the U.S. national phase application under 35 U.S.C. §371 of PCT/JP2006/300022, filed Jan. 5, 2006, which claims priority to Japanese Application No. 2005-012119, filed Jan. 19, 2005, the entireties of both of which are incorporated herein by reference.

TECHNICAL FIELD

The present invention relates to a semiconductor integrated circuit and, more particularly, to a technique suitable for inspection of semiconductor integrated circuits.

BACKGROUND ART

A semiconductor integrated circuit has circuit elements including a transistor generated on a semiconductor material or insulating material or in a semiconductor material and is designed to have an electronic circuit function. Semiconductor integrated circuits are used in a personal computer, cellular phone, and the like, and the demand for sophistication and higher integration thereof has been increasing in recent years.

A semiconductor integrated circuit must undergo operation inspection before shipment because of the need to fulfill a function as an electronic function, and thus, an inspection circuit is generally provided therein in addition to a circuit for normal operation.

Prior-art techniques for operation inspection include ones shown in FIGS. 6 and 7. The prior-art techniques are each a semiconductor integrated circuit having a plurality of flip-flops, each composed of a master latch and a slave latch, and selectors provided corresponding to the flip-flops, respectively. An output terminal of each slave latch is connected to an input terminal of the selector provided corresponding to one of the flip-flops which is different from the flip-flop including the slave latch.

For example, in the technique described in FIG. 6 (hereinafter simply referred to as the "first prior-art technique), the plurality of flip-flops are connected in series to constitute a scan chain by electrically connecting the output terminal of each slave latch and the input terminal of the selector provided corresponding to one of the flip-flops which is different from the flip-flop including the slave latch, and inspection is performed using the scan chain.

In the technique described in FIG. 7 (hereinafter simply referred to as the "second prior-art technique), each flip-flop further has a different test latch, and two-pattern inspection can be performed in scan chain-based inspection. Note that the first and second prior-art techniques are described in detail in Patent Document 1 below.

[Non-patent Document 1]: Bulent I. Dervisouglu et al., "Desig for testability: using scanpath techniques for path-delay test and measurement," Proceedings of International of International Test Conference, October 1991, pp. 365-374

However, the first prior-art technique is incapable of performing a so-called two-pattern test at the time of inspection. A two-pattern test is an inspection indispensable for a sophisticated, highly integrated circuit which requires checking for signal delays.

On the other hand, although the second prior-art technique is capable of performing a so-called two-pattern test, a test latch needs to be provided in each flip-flop, thus resulting in an increase in the space occupied by the flip-flop.

DISCLOSURE OF THE INVENTION

Under the circumstances, the present invention has as its object to provide a semiconductor integrated circuit capable of performing a so-called two-pattern test without significantly increasing the occupied space.

In order to achieve the above-described object, the present invention adopts, e.g., the following means.

The first means is a semiconductor integrated circuit having a plurality of flip-flops and selectors provided corresponding to the plurality of flip-flops, respectively, wherein each flip-flop has a master latch and a slave latch which is electrically connected to the master latch, and each selector is electrically connected to the master latch of the flip-flop corresponding to the selector, and at least one of the selectors is also connected to the master latch of one of the flip-flops which is different from the flip-flop corresponding to the selector.

In the means, the selector is desirably connected such that an output from the master latch in the flip-flop, which is different from the flip-flop corresponding to the selector, is input to the selector.

In the means, the selector is desirably connected such that an output from the slave latch of the flip-flop, which is different from the flip-flop corresponding to the selector, is also input to the selector.

In the means, the plurality of flip-flops and the selectors desirably constitute a scan chain.

The second means is a semiconductor integrated circuit having a first logic circuit, a plurality of selectors which accept signals from the first logic circuit, master latches which are provided corresponding to the plurality of selectors, respectively, and accept signals from the selectors, slave latches which are provided corresponding to the master latches, respectively, and accept signals from the master latches, and a second logic circuit which accepts signals from the slave latches, wherein one of the plurality of selectors selects one of a signal from the semiconductor integrated circuit and a signal from the first logic circuit and outputs the signal to the corresponding master latch, and each of the others of the selectors selects one of a signal from one of the master latches which is different from the master latch corresponding to the selector and a signal from the first logic circuit and outputs the signal to the corresponding master latch. In the means, the plurality of selectors and the master latches provided corresponding to the selectors desirably constitute a scan chain.

With the above-described means, the present invention can provide a semiconductor integrated circuit capable of performing so-called one-pattern and two-pattern tests without significantly increasing occupied space.

| Description of Symbols | |
|---|---|
| MUX11, MUX21 | first selector |
| MUX12, MUX22 | second selector |
| MUX13, MUX23 | third selector |
| MUX14, MUX24 | fourth selector |
| ML11, ML21 | first master latch |
| ML12, ML22 | second master latch |
| ML13, ML23 | third master latch |
| ML14, ML24 | fourth master latch |
| SL11, SL21 | first slave latch |
| SL12, SL22 | second slave latch |
| SL13, SL23 | third slave latch |
| SL11, SL24 | fourth slave latch |
| FF11, FF21 | first flip-flop |
| FF12, FF22 | second flip-flop |
| FF13, FF23 | third flip-flop |
| FF14, FF24 | fourth flip-flop |
| CKT11, 21 | upstream-side logic circuit |
| CKT12, 22 | downstream-side logic circuit |

BEST MODE FOR CARRYING OUT THE INVENTION

Embodiments of the present invention will be described below with reference to the drawings.

First Embodiment

A semiconductor integrated circuit of this embodiment has circuit elements including a transistor generated on a semiconductor material or insulating material or in a semiconductor material and is designed to have an electronic circuit function. A known configuration can be adopted except in circuit arrangement.

Figure 1:
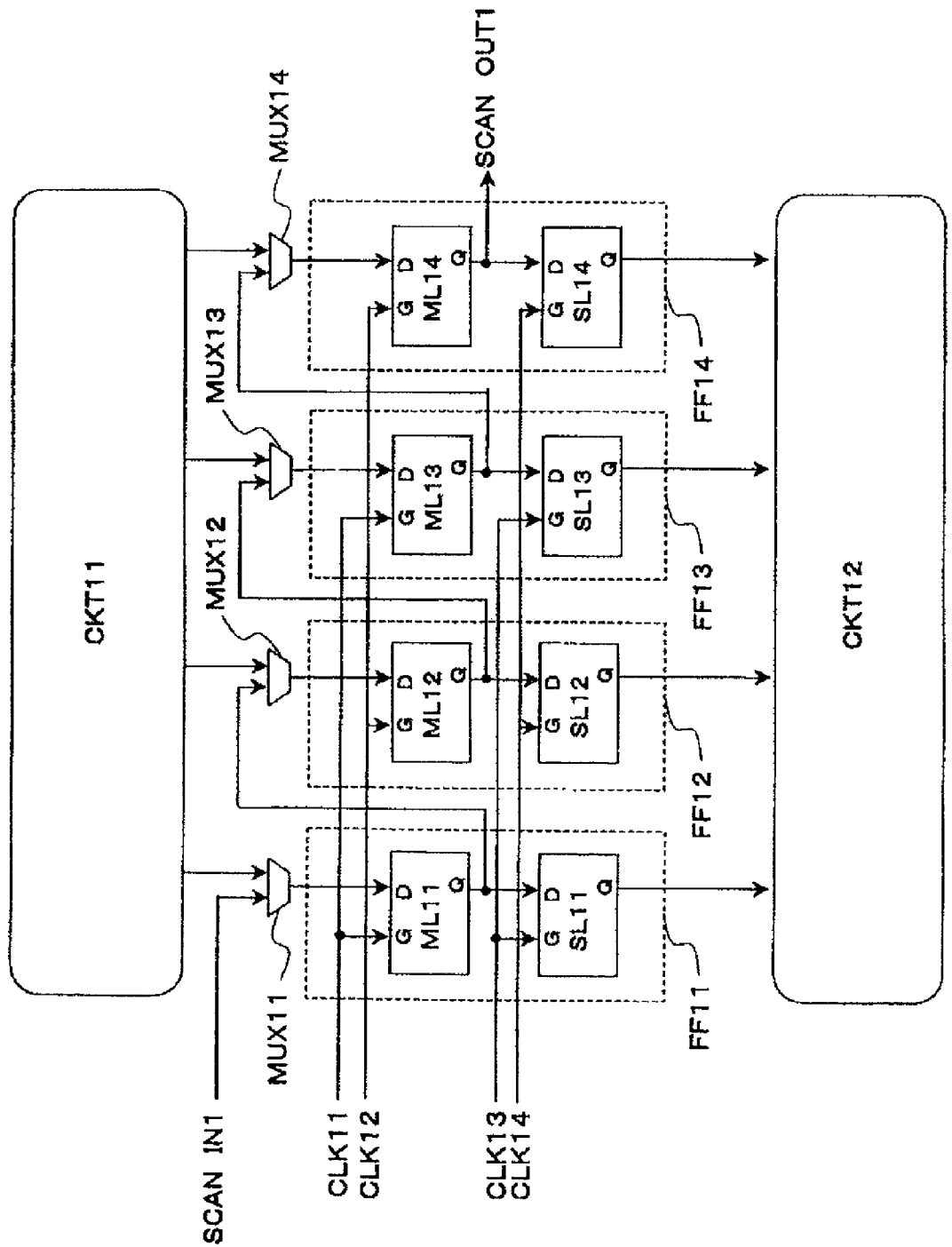
FIG. 1 is a block diagram of a semiconductor integrated circuit according to a first embodiment.

FIG. 1 is a block diagram of a semiconductor integrated circuit according to this embodiment. The semiconductor integrated circuit according to this embodiment is configured to have four flip-flops FF11, FF12, FF13, and FF14 (hereinafter, the flip-flop FF11 will also be simply referred to as a "first flip-flop," the flip-flop FF12 will also be simply referred to as a "second flip-flop," the flip-flop FF13 will also be simply referred to as a "third flip-flop," and the flip-flop FF14 will also be simply referred to as a "fourth flip-flop"), each having a master latch and a slave latch, and four selectors MUX11, MUX12, MUX13, and MUX14 (hereinafter, the selector MUX11 will also be simply referred to as a "first selector," the selector MUX12 will also be simply referred to as a "second selector," the selector MUX13 will also be simply referred to as a "third selector," and the selector MUX14 will also be simply referred to as a "fourth selector") which are provided corresponding to the flip-flops, respectively, to control inputs to them.

The selectors MUX11, MUX12, MUX13, and MUX14 each have two input terminals and one output terminal, and one of the input terminals of each selector is electrically connected to an upstream-side logic circuit CKT11. Note that the term "terminal" in this specification refers to a gateway for electric current which is provided for electrical connection and includes one which has no hardware or the like attached thereto and is simply composed of a lead.

The other of the input terminals of the first selector MUX11 is a terminal for inputting a scan test signal and is configured to be electrically connectable to an external scan test signal input apparatus at the time of a scan test (in FIG. 1, a scan test signal from a scan test signal apparatus is denoted by "SCAN IN 1").

Note that each selector selects and outputs either one of signals input to the two input terminals, and which one of the signals is selected is controlled by a connected power supply (not shown).

As described above, each flip-flop in this embodiment has the master latch and the slave latch (hereinafter, the master latch in the first flip-flop will be simply referred to as a "first master latch ML11," and the slave latch therein will be simply referred to as a "first slave latch SL11"; the same applies to the second, third, and fourth flip-flops.) The master latches and slave latches each have a G terminal and a D terminal as input terminals and a Q terminal as an output terminal. Note that the D terminal of each master latch is electrically connected to the output terminal of the selector provided corresponding thereto, the Q terminal is electrically connected to the D terminal of the slave latch provided in the flip-flop including the master latch, and the Q terminal of each slave latch is electrically connected to a downstream-side logic circuit CKT12.

The G terminals of the first and third master latches ML11 and ML13 in the first and third flip-flops FF11 and FF13 are electrically connected to an external first clock signal source CLK11, and the G terminals of the second and fourth master latches ML12 and ML14 in the second and fourth flip-flops FF12 and FF14 are electrically connected to an external second clock signal source CLK12. Note that these clock signal sources whose operations will be described in detail later each output a clock signal which controls whether to enable or disable the operation of the connected master latches.

The G terminals of the first and third slave latches SL11 and SL13 in the first and third flip-flops FF11 and FF13 are electrically connected to an external third clock signal source CLK13, and the G terminals of the second and fourth slave latches SL12 and SL14 in the second and fourth flip-flops FF12 and FF14 are electrically connected to an external fourth clock signal source CLK14. Note that these clock signal sources each output a clock signal which controls whether to enable or disable the operation of the slave latches, as in the case of the master latches.

One of the input terminals of the second selector MUX12 provided corresponding to the second flip-flop FF12 which is different from the other electrically connected to the upstream-side logic circuit CKT11 is electrically connected to the Q terminal of the first master latch ML11 of the first flip-flop FF11. Similarly, ones of the input terminals of the third and fourth selectors MUX13 and MUX14 provided corresponding to the third and fourth flip-flops FF13 and FF14 which are different from the others electrically connected to the upstream-side logic circuit CKT11 are electrically connected to the Q terminals of the master latches ML12 and ML13 of the second and third flip-flops FF12 and FF13, respectively. The Q terminal of the fourth flip-flop FF14 is connected to the D terminal of the slave latch SL14, and a terminal for scan test signal detection is formed to branch off from the Q terminal such that the Q terminal is electrically connectable to a scan test signal detection apparatus at the time of a scan test (a state in which the master latches of a plurality of flip-flops are connected in series through selectors will be expressed as a "scan chain" throughout this specification because the connection extends in a chain).

Figure 2:
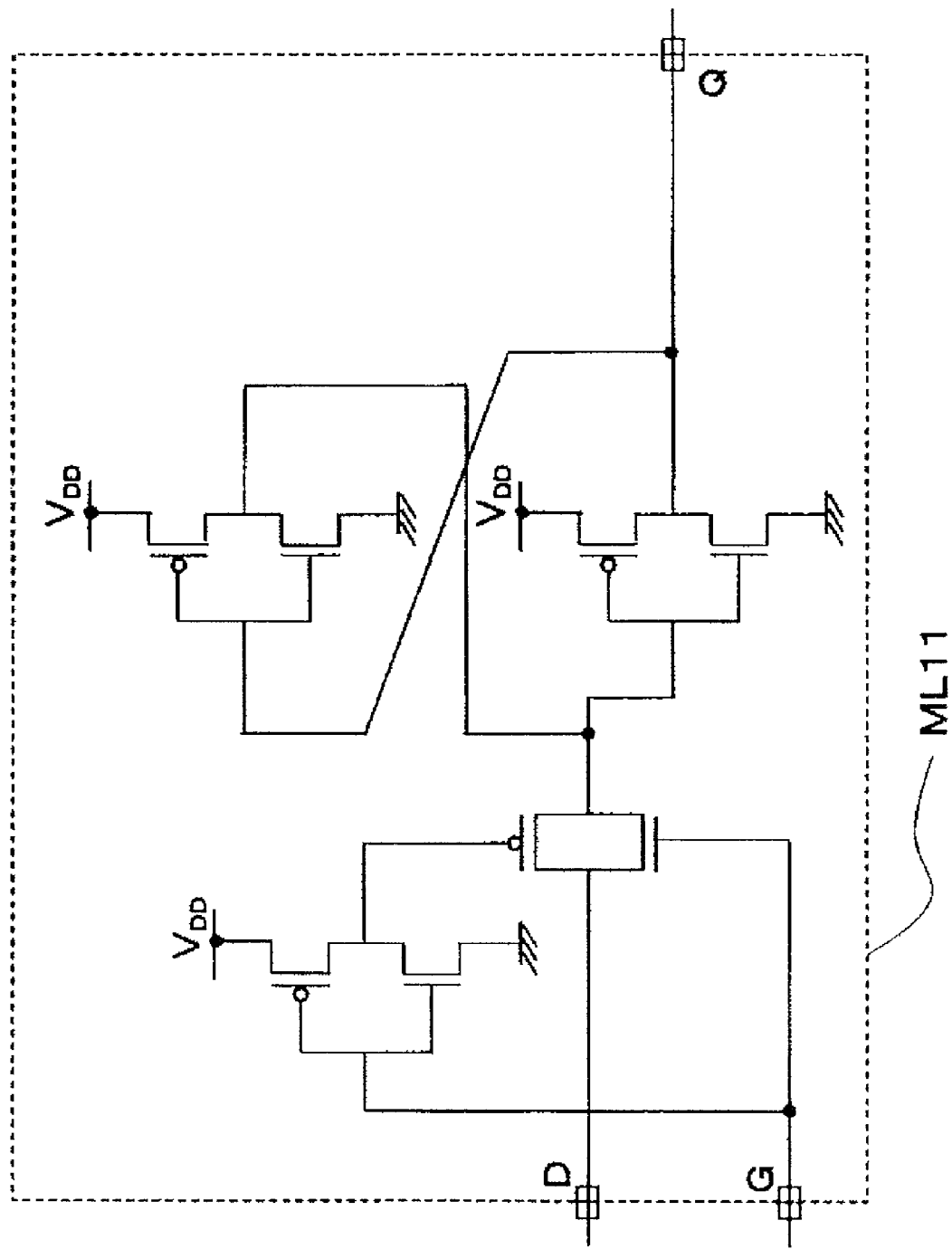
FIG. 2 is an equivalent circuit diagram of a master latch in the semiconductor integrated circuit according to the first embodiment.

The configuration of the latches in each flip-flop will be described here. Each flip-flop in this embodiment has the master latch and the slave latch, each of which outputs, from the Q terminal, a voltage input from the D terminal when a voltage input to the G terminal is in the ON state and outputs a voltage $V_{DD}$ input from an external power supply when the voltage is in the OFF state. The latches each have a configuration as shown in FIG. 2. Although the latch in FIG. 2 shows the master latch ML11, not only the other master latches but also the slave latches can also adopt the same configuration as that in FIG. 2. Alternatively, each latch can adopt any of other known circuit configurations or, of course, a combination of them.

The operation in the inspection on the semiconductor integrated circuit according to this embodiment (hereinafter simply referred to as "this inspection") will be described next. Although this inspection can be performed at various times, a mode in which this inspection is performed, e.g., before shipment of a semiconductor integrated circuit after formation of the semiconductor integrated circuit can be said to be the most preferable one. Since the semiconductor integrated circuit according to this embodiment can perform a one-pattern test and a two-pattern test, these pattern tests will be described.

Figure 3:
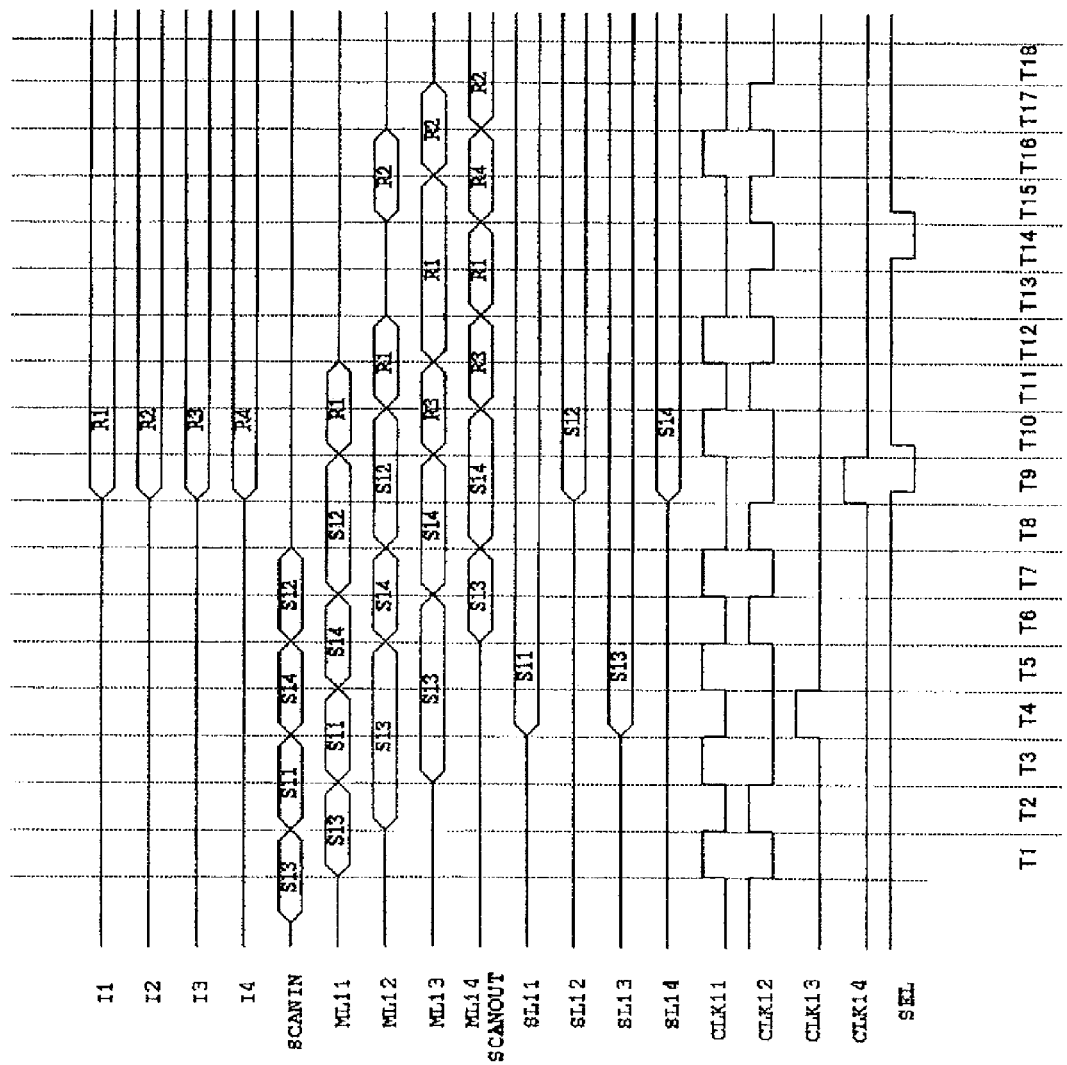
FIG. 3 is a chart showing the signal voltages of components in a one-pattern test for the semiconductor integrated circuit according to the first embodiment.

First, a one-pattern test in this inspection will be described. FIG. 3 is a chart showing the voltages of signals in the one-pattern test for the semiconductor integrated circuit according to this embodiment.

The one-pattern test will be described below step by step with reference to FIG. 3. FIG. 3 is a chart for explaining the relationship among signals in this inspection. Reference character I1 represents the voltage of a signal input from the upstream-side logic circuit CKT11 to the first selector MUX11, I2 represents the voltage of a signal input from the upstream-side logic circuit CKT11 to the second selector MUX12, I3 represents the voltage of a signal input from the upstream-side logic circuit CKT11 to the third selector MUX13, I4 represents the voltage of a signal input from the upstream-side logic circuit CKT11 to the fourth selector MUX14, SCAN IN represents the voltage of a scan test signal from the scan test signal apparatus, ML11 represents the voltage of a signal from the Q terminal in the first master latch ML11, ML12 represents the voltage of a signal output from the Q terminal in the second master latch ML12, ML13 represents the voltage of a signal output from the Q terminal in the third master latch ML13, ML14 represents the voltage of a signal output from the Q terminal in the fourth master latch ML14, and SEL represents the voltage of a signal input to the selectors MUX11, MUX12, MUX13, and MUX14. Note that since the voltage ML14 has the same value as the voltage of SCAN OUT 1, as shown in FIG. 1, ML14 and SCAN OUT are shown in the same area. Reference character SL11 represents the voltage of a signal output from the Q terminal of the first slave latch SL11, and the same applies to reference characters SL12, SL13, and SL14. Reference characters CLK11, CLK12, CLK13, and CLK14 represent the voltages of clock signals, as described above. Note that the abscissa indicates time.

First, in a time period T1 in FIG. 3, the voltage SCAN IN of the scan test signal is S13, the voltage CLK11 is in the ON state, the voltage CLK12 is in the OFF state, and the voltage SEL is in the ON state. Note that although this embodiment is configured such that each selector selects the scan test signal or the signal output from the Q terminal of the connected master latch when the voltage SEL is in the ON state, another embodiment may be configured such that the selector selects the other, i.e., the input from the upstream-side logic circuit CKT11 when SEL is in the ON state.

Since the voltage SEL is in the ON state, the first selector MUX11 outputs the scan test signal (S13) input from the scan test signal apparatus to the first master latch ML11. The first master latch is in the ON state in this time period, and thus it outputs the scan test signal (S13) from the Q terminal without any processing.

In a time period T2, the voltage of the scan test signal is S11, the voltage CLK11 is in the OFF state, the voltage CLK12 is in the ON state, and the voltage SEL is in the ON state. Note that CLK14 is in the OFF state except in a time period T9 (to be described later).

In this time period, a voltage applied to the G terminal is in the OFF state in the first master latch ML11, and the voltage of the signal output from the Q terminal of the first master latch ML11 becomes S13. A voltage applied to the G terminal is in the ON state in the second master latch ML12, and the voltage of the signal output from the second master latch ML12 becomes equal to that of the signal output from the Q terminal of the first master latch ML11, i.e., S13.

In a time period T3, the voltage of the scan test signal remains S11, the voltage CLK11 is in the ON state, the voltage CLK 12 is in the OFF state, and the voltage SEL is in the ON state.

In this time period, the voltage applied to the G terminal is in the ON state in the first master latch ML11, and the output from the Q terminal of the first master latch becomes S11. The voltage applied to the G terminal is in the OFF state in the second master latch, and the output from the Q terminal of the second master latch is kept at that in the time period T2, S13. A voltage applied to the G terminal is in the ON state in the third master latch ML13, and the output from the Q terminal of the third master latch ML13 becomes S13.

In a time period T4, the voltage of the scan test signal is S14, the voltage CLK11 is in the OFF state, the voltage CLK 12 is in the OFF state, and the voltage CLK13 is in the ON state.

In this time period, the voltage applied to the G terminal is in the OFF state in the first master latch, and the voltage of the signal output from the Q terminal remains at S11. The voltage applied to the G terminal is also in the OFF state in the second master latch, and the voltage of the signal output from the Q terminal is kept at S13. The voltage applied to the G terminal is also in the OFF state in the third master latch, and the voltage of the signal output from the Q terminal remains at S13. On the other hand, a voltage applied to the G terminal in the first slave latch SL11 is in the ON state, and the voltage of the signal output from the Q terminal of the first slave latch SL11 becomes equal to that of the signal output from the Q terminal of the first master latch, S11. A voltage applied to the G terminal of the third slave latch SL13 is also in the ON state, and the voltage of the signal output from the Q terminal of the third slave latch SL13 becomes equal to that of the signal output from the third master latch ML13, S13.

In a time period T5, the voltage of the scan test signal remains at S14, the voltage CLK11 is in the ON state, the voltage CLK12 is in the OFF state, and the voltage CLK13 is in the OFF state.

In this time period, the voltage applied to the G terminal is in the ON state in the first master latch, and the voltage of the signal output from the Q terminal becomes S14. The voltage applied to the G terminal is in the OFF state in the second master latch, and the voltage of the signal output from the Q terminal of the second master latch ML12 remains at S13. Although the voltage applied to the G terminal of the third master latch ML13 is in the ON state, the voltage of the signal output from the Q terminal of the second master latch ML12 is S13, and the voltage of the signal output from the Q terminal remains at S13. The voltage applied to the G terminal of the first slave latch SL11 is in the OFF state, and the voltage of the signal output from the Q terminal remains at S11. The voltage of the signal output from the Q terminal of the third slave latch SL13 also remains at S13.

In a time period T6, the voltage of the scan test signal is S12, the voltage CLK11 is in the OFF state, the voltage CLK12 is in the ON state, and the voltage CLK13 is in the OFF state.

In this time period, the voltage applied to the G terminal is in the OFF state in the first master latch ML11, and the voltage of the signal output from the Q terminal is kept at S14. The voltage applied to the G terminal is in the ON state in the second master latch ML12, and the voltage of the signal output from the Q terminal of the second master latch ML12 becomes equal to that of the signal output from the Q terminal of the first master latch, S14. The voltage applied to the G terminal is in the OFF state in the third master latch ML13, and the voltage of the signal output from the Q terminal remains at S13. A voltage applied to the G terminal is in the ON state in the fourth master latch ML14, and the voltage of the signal output from the Q terminal of the fourth master latch ML14 becomes equal to that of the signal output from the Q terminal of the third master latch ML13, S13. Note that the voltages of the signals output from the Q terminals in the first and third slave latches are equal to those in the time period T5.

In a time period T7, the voltage of the scan test signal remains at S12, the voltage CLK11 is in the ON state, the voltage CLK12 is in the OFF state, and the voltage CLK13 is in the OFF state.

In this time period, the voltage applied to the G terminal is in the ON state in the first master latch ML11, and the voltage of the signal output from the Q terminal becomes S12. The voltage applied to the G terminal of the second master latch ML12 is in the OFF state, and the voltage of the signal output from the Q terminal of the second master latch ML12 remains at S14. The voltage applied to the G terminal of the third mater latch MK13 is in the ON state, and the signal output from the Q terminal of the third master latch ML13 becomes equal to a signal input to the D terminal, i.e., the signal output from the Q terminal of the second master latch ML12, S14. The voltage applied to the G terminal of the fourth master latch ML14 is in the OFF state, and the voltage of the signal output from the Q terminal remains at S13. Note that the voltages of the signals output from the Q terminals in the first and third slave latches are equal to those in the time period T5.

In a time period T8, the scan test signal is not input, the voltage CLK11 is in the OFF state, the voltage CLK12 is in the ON state, and the voltage CLK13 is in the OFF state.

In this time period, the voltage applied to the G terminal is in the OFF state in the first master latch ML11, and the voltage of the signal output from the Q terminal remains at S12. The voltage applied to the G terminal of the second master latch ML12 is in the ON state, and the voltage of the signal output from the Q terminal of the second master latch ML12 becomes S12. The voltage applied to the G terminal of the third master latch ML13 is in the OFF state, and the voltage of the signal output from the Q terminal of the third master latch ML13 remains at S14. The voltage applied to the G terminal of the fourth master latch ML14 is in the ON state, and the voltage of the signal output from the Q terminal becomes S14.

Note that the voltages of the signals output from the Q terminals in the first and third slave latches are equal to those in the time period T5.

In the time period T9, the scan test signal is not input (ditto for subsequent time periods), the voltage CLK11 is in the OFF state, the voltage CLK12 is in the OFF state, the voltage CLK13 is in the OFF state, and the voltage CLK14 is in the ON state. The voltage I1 with a value R1, the voltage I2 with a value R2, the voltage I3 with a value R3, and the voltage I4 with a value R4 are input, and the voltages are kept constant at these values thereafter. During the time period T9, the voltage SEL is switched, thereby switching the source of each of the selectors MUX11, MUX12, MUX13, and MUX14. In T9, the signal from the upstream-side logic circuit CKT11 is input.

In this time period, the voltage applied to the G terminal in the first master latch ML11 is in the OFF state, and the voltage of the signal output from the Q terminal remains at S12. The voltage applied to the G terminal of the second master latch ML12 is in the OFF state, and the signal output from the Q terminal remains at S12. The voltage applied to the G terminal of the third master latch ML13 is in the OFF state, and the signal output from the Q terminal remains at S14. The voltage applied to the G terminal of the fourth master latch ML14 is in the OFF state, and the signal output from the Q terminal remains at S14. In this time period, since CLK14 is in the ON state, a voltage applied to the G terminal of the second slave latch SL12 is in the ON state, and the voltage of the signal output from the Q terminal of the second slave latch SL12 becomes equal to that of the signal output from the Q terminal of the second master latch ML12, S12. Similarly, the voltage of the signal output from the Q terminal of the fourth slave latch SL14 becomes equal to that of the signal output from the fourth master latch ML14, S14. Note that the voltages of the signals output from the Q terminals in the first and third slave latches are equal to those in the time period T5.

In a time period T10, the voltage CLK11 is in the ON state and the voltage CLK12 is in the OFF state.

In this time period, the voltage applied to the G terminal in the first mater latch ML11 is in the ON state, and the voltage of the signal output from the Q terminal becomes equal to that of a signal input to the D terminal. Since the input of each selector has been switched by SEL during the time period T9, the voltage of the signal output from the Q terminal of the first master latch ML11 becomes R1. The voltage applied to the G terminal of the second master latch ML12 is in the OFF state, and the voltage of the signal output from the Q terminal remains at S12. The voltage applied to the G terminal of the third master latch ML13 is in the ON state, and the voltage of the signal output from the Q terminal becomes equal to that of a signal input to the D terminal. Since the input of the corresponding selector has been switched by SEL during the time period T9, the voltage of the signal output from the Q terminal of the third master latch ML13 becomes R3. The voltage applied to the G terminal of the fourth master latch ML14 is in the OFF state, and the voltage of the signal output from the Q terminal remains at S14. Note that the voltages of the signals output from the Q terminals in the first to fourth slave latches are equal to those in the time period T9.

In a time period T11, the voltage CLK11 is in the OFF state and the voltage CLK12 is in the ON state.

In this time period, the voltage applied to the G terminal of the first master latch ML11 is in the OFF state, and the voltage of the signal output from the Q terminal remains at R1. The voltage applied to the G terminal of the second master latch ML12 is in the ON state, and the voltage of the signal output from the second master latch ML12 becomes equal to that of the signal output from the Q terminal of the first master latch, R1. The voltage applied to the G terminal of the third master latch ML13 is in the OFF state, and the voltage of the signal output from the Q terminal remains at R3. The voltage applied to the G terminal of the fourth master latch ML14 is in the ON state, and the voltage of the signal output from the Q terminal becomes equal to that of the signal output from the Q terminal of the third master latch ML13, R3. Note that the voltages of the signals output from the Q terminals in the first to fourth slave latches are equal to those in the time period T10.

In a time period T12, the voltage CLK11 is in the ON state and the voltage CLK12 is in the OFF state.

In this time period, the voltage applied to the G terminal of the first master latch ML11 is in the ON state, and the voltage of the signal output from the Q terminal becomes equal to that of a signal input from the D terminal. Since SEL has already been switched to select the scan test signal as the input during the time period T10, the D terminal has no input signal. The voltage applied to the G terminal of the second master latch ML12 is in the OFF state, and the voltage of the signal output from the Q terminal remains at R1. Since the voltage of the G terminal of the third master latch ML13 is in the ON state, and the third selector MUX13 has been set by the voltage SEL to select the voltage of the signal output from the Q terminal of the second master latch ML12, the output from the Q terminal becomes R1. The voltage of the G terminal of the fourth master latch ML14 is in the OFF state, and the voltage of the signal output from the Q terminal remains at R3. Note that the voltages of the signals output from the Q terminals in the first to fourth slave latches are equal to those in the time period T11.

In a time period T13, the voltage CLK11 is in the OFF state and the voltage CLK12 is in the ON state.

In this time period, the voltage applied to the G terminal of the first master latch ML11 is in the OFF state, and the voltage of the signal output from the Q terminal remains unchanged from the state in T12. The voltage applied to the G terminal of the second master latch ML12 is in the ON state, and the voltage of the signal output from the Q terminal becomes equal to that of a signal input from the D terminal. However, since SEL has already been switched to select the scan test signal as the input during the time period T10, the D terminal has no input signal. The voltage applied to the G terminal of the third master latch is in the OFF state, and the voltage of the signal output from the Q terminal remains at R1. The voltage applied to the G terminal of the fourth master latch ML14 is in the ON state, and the voltage of the signal output from the Q terminal becomes equal to the signal output from the Q terminal of the third master latch ML13, R1. Note that the voltages of the signals output from the Q terminals in the first to fourth slave latches are equal to those in the time period T12.

In a time period T14, the voltage CLK11 is in the OFF state and the voltage CLK12 is in the OFF state.

In this time period, the voltages applied to the G terminals of the first and second master latches ML11 and ML12 are in the OFF state, and the voltages output from the Q terminals remain the same as those in T13. The voltage applied to the G terminal of the third master latch ML13 is in the OFF state, and the voltage output from the Q terminal remains at R1. The voltage applied to the G terminal of the fourth master latch ML14 is in the OFF state, and the voltage of the signal output from the Q terminal remains at R1. Note that the voltages of the signals output from the Q terminals in the first to fourth slave latches are equal to those in the time period T13.

In a time period T15, CLK11 is in the OFF state, and CLK12 is in the ON state. During the time period T15, the voltage SEL is switched, thereby switching the source of each of the selectors MUX11, MUX12, MUX13, and MUX14. In T15, the signal from 11 upstream of the logic circuit is input.

In this time period, the voltage applied to the G terminal of the first master latch ML11 is in the OFF state, and the voltage output from the Q terminal remains the same as that in T14. Since the voltage applied to the G terminal of the second master latch ML12 is in the ON state, and the voltage SEL has been switched to the ON state during the time period T14, the second selector has been set to select the signal input from the upstream-side logic circuit CKT11. The voltage of the signal output from the Q terminal of the second master latch ML12 thus becomes R2. The voltage applied to the G terminal of the third master latch ML13 is in the OFF state, and the voltage of the signal output from the Q terminal remains at R1. Since the voltage applied to the G terminal of the fourth master latch ML14 is in the ON state, and the voltage SEL has been switched to the ON state during the time period T14, the fourth selector has been set to select the signal input from the upstream-side logic circuit CKT11. The voltage of the signal output from the Q terminal of the fourth master latch ML14 thus becomes R4. Note that the voltages of the signals output from the Q terminals in the first to fourth slave latches are equal to those in the time period T14.

In a time period T16, CLK11 is in the ON state, and CLK12 is in the OFF state. Note that during the time period T14, each selector has been set to select the signal different from the one from the upstream logic circuit by setting the voltage SEL to the OFF state.

In this time period, although the voltage applied to the G terminal of the first master latch ML11 is in the ON state, since the scan test signal is not input, there is no output from the Q terminal. The voltage applied to the G terminal of the second master latch ML12 is in the OFF state, and the voltage of the signal output from the Q terminal remains at R2. The voltage applied to the G terminal of the third master latch ML13 is in the ON state, and the voltage of the signal output from the Q terminal becomes equal to that of the signal output from the Q terminal of the second master latch ML12, R2. The voltage of the G terminal of the fourth master latch ML14 is in the OFF state, and the voltage of the signal output from the Q terminal remains at R4.

In a time period T17, the voltage CLK11 is in the OFF state and the voltage CLK12 is in the ON state.

In this time period, the voltage applied to the G terminal of the first master latch ML11 is in the OFF state, and the voltage output from the Q terminal remains the same as that in T16. The voltage applied to the G terminal of the second master latch ML12 is in the ON state, and the voltage of the signal output from the Q terminal becomes equal to that of a signal input to the D terminal. Since the scan test signal is not input, there is no particular output from the Q terminal. The voltage applied to the G terminal of the third master latch ML13 is in the OFF state, and the voltage of the signal output from the Q terminal remains at R2. The voltage applied to the G terminal of the fourth master latch ML14 is in the ON state, and the voltage of the signal output from the Q terminal becomes equal to that of the signal output from the Q terminal of the third master latch ML13, R2.

As described above, it is possible to implement a one-pattern test by the semiconductor integrated circuit according to this embodiment.

Figure 4:
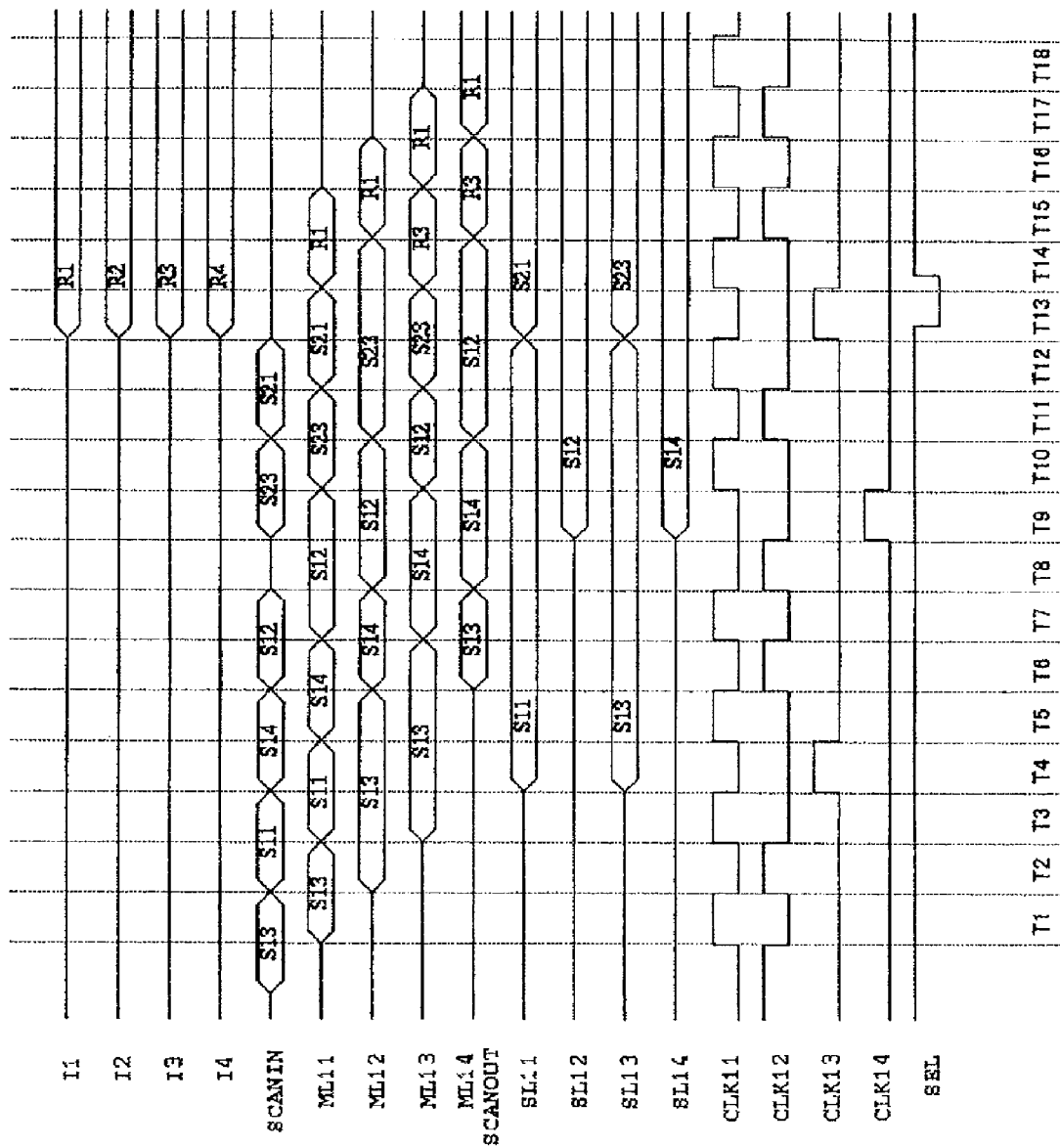
FIG. 4 is a chart showing the signal voltages of the components in a two-pattern test for the semiconductor integrated circuit according to the first embodiment.

A two-pattern test will be similarly described next. FIG. 4 is a chart for explaining the relationship among signals in this inspection. Reference characters I1, I2, . . . are almost the same as those in FIG. 3.

First, in a time period T1 in FIG. 4, the voltage SCAN IN of the scan test signal is S13, the voltage CLK11 is in the ON state, the voltage CLK12 is in the OFF state, the voltages CLK13 and CLK14 are in the OFF state, and the voltage SEL is in the ON state. Note that SEL is in the ON state except in a time period T13 (to be described later), CLK13 is in the ON state in a time period T4 and the time period T13 and in the OFF state in the other time periods, and CLK14 is in the ON state only in a time period T9 and in the OFF state in the other time periods.

The voltage SEL is in the ON state, and the first to fourth selectors MUX11, MUX12, MUX13, and MUX14 each output the signal different from the one input from the upstream-side logic circuit CKT11 to the corresponding master latch. That is, in the time period T1, the voltage of the signal output from the Q terminal of the first master latch ML11 becomes S13.

In a time period T2, the voltage of the scan test signal is S11, the voltage CLK11 is in the OFF state, and the voltage CLK12 is in the ON state.

In this time period, the voltage CLK11 is in the OFF state, and the voltage of the signal output from the first master latch ML11 remains at S13. The voltage input to the G terminal is in the ON state, and the voltage of the signal output from the second master latch ML12 becomes equal to the output from the Q terminal of the first master latch ML11, S13.

In a time period T3, the voltage of the scan test signal is S11, the voltage CLK11 is in the ON state, and the voltage CLK12 is in the OFF state.

In this time period, the input to the G terminal in the first master latch ML11 is in the ON state, and the voltage of the signal output from the Q terminal becomes S11. The voltage input to the G terminal in the second master latch ML12 is in the OFF state, and the voltage of the signal output from the Q terminal remains at S13. The voltage input to the G terminal in the third master latch ML14 is in the ON state, and the voltage of the signal output from the Q terminal becomes equal to that of the signal output from the Q terminal in the second master latch ML12, S13.

In a time period T4, the voltage of the scan test signal is S14, the voltage CLK11 is in the OFF state, the voltage CLK12 is in the OFF state, and the voltage CLK13 is in the ON state.

In this time period, the input to the G terminal in the first master latch ML11 is in the OFF state, and the voltage of the signal output from the Q terminal remains at S11. The voltage input to the G terminal in the second master latch ML12 is also in the OFF state, and the voltage of the signal output from the Q terminal remains at S13. The voltage input to the G terminal of the third master latch ML13 is also in the OFF state, and the voltage of the signal output from the Q terminal remains at S13. Since CLK13 is in the ON state in this time period, the voltage input to the G terminal of the first slave latch SL11 is in the ON state, and the voltage of the signal output from the Q terminal becomes equal to that of the signal output from the Q terminal of the first master latch ML11, S11. The voltage input to the G terminal in the third slave latch SL11 is also in the ON state, and the output from the Q terminal of the third slave latch SL13 becomes equal to that of the signal output from the third slave latch SL13, S13.

In a time period T5, the voltage of the scan test signal is S14, the voltage CLK11 is in the ON state, and the voltage CLK12 is in the OFF state.

In this time period, the voltage input to the G terminal of the first master latch ML11 is in the ON state, and the voltage output from the Q terminal becomes equal to that of the scan test signal, S14. The voltage input to the G terminal of the second master latch ML12 is in the OFF state, and the voltage output from the Q terminal remains at S13. The voltage input to the G terminal of the third master latch ML13 is in the ON state, and the voltage of the signal output from the Q terminal becomes equal to that of the signal output from the Q terminal of the second master latch ML12, S13. Also, CLK13 is in the OFF state, and the voltages of the signals output from the Q terminals of the first and third slave latches remain at S11 and S13, respectively.

In a time period T6, the voltage of the scan test signal is S12, the voltage CLK11 is in the OFF state, and the voltage CLK12 is in the ON state.

In this time period, the voltage input to the G terminal of the first master latch ML11 is in the OFF state, and the voltage of the signal output from the Q terminal remains at S14. The voltage input to the G terminal of the second master latch ML12 is in the ON state, and the voltage of the signal output from the Q terminal becomes equal to that of the signal output from the Q terminal of the first master latch ML11, S14. The voltage input to the G terminal of the third master latch ML13 is in the OFF state, and the voltage of the signal output from the Q terminal remains at S13. The voltage input to the G terminal of the fourth master latch ML14 is in the ON state in this time period, and the voltage of the signal output from the Q terminal becomes equal to that of the signal output from the Q terminal of the third master latch ML13, S13.

In a time period T7, the voltage of the scan test signal remains S12, the voltage CLK11 is in the ON state, and the voltage CLK12 is in the OFF state.

In this time period, the voltage of the signal input to the G terminal of the first master latch ML11 is in the ON state, and the voltage of the signal output from the Q terminal becomes S12. The voltage of the signal input to the G terminal of the second master latch ML12 is in the OFF state, and the voltage of the signal output from the Q terminal remains at S14. The voltage of the signal input to the G terminal of the third master latch ML13 is in the ON state, and the voltage of the signal output from the Q terminal becomes equal to that of the signal output from the Q terminal in the second master latch ML12, S14. The voltage of the signal input from the G terminal of the fourth master latch ML14 is in the OFF state, and the voltage of the signal output from the Q terminal remains at S13.

In a time period T8, the scan test signal is not input, the voltage CLK11 is in the OFF state, and the voltage CLK12 is in the ON state.

In this time period, the voltage of the signal input to the G terminal of the first master latch ML11 is in the OFF state, and the voltage of the signal output from the Q terminal remains at S12. The voltage of the signal input to the G terminal of the second master latch ML12 is in the ON state, and the voltage of the signal output from the Q terminal becomes equal to that of the signal output from the Q terminal of the first master latch ML11, S12. The voltage of the signal input to the G terminal of the third master latch ML13 is in the OFF state, and the voltage of the signal output from the Q terminal remains at S14. The voltage of the signal input from the G terminal of the fourth master latch ML14 is in the ON state, and the voltage of the signal output from the Q terminal becomes equal to that of the signal output from the Q terminal of the third master latch ML13, S14.

In a time period T9, the voltage of the scan test signal is S23, the voltage CLK11 is in the OFF state, the voltage CLK12 is in the OFF state, and the voltage CLK14 is in the ON state.

In this time period, the voltage of the signal input to the G terminal of the first master latch ML11 is in the OFF state, and the voltage of the signal output from the Q terminal remains at S12. The voltage of the signal input from the G terminal of the second master latch ML12 is also in the OFF state, and the voltage of the signal output from the Q terminal remains at S12. The voltage of the signal input to the G terminal of the third master latch ML13 is also in the OFF state, and the voltage of the signal output from the Q terminal remains at S14. The voltage input to the G terminal of the fourth master latch ML14 is also in the OFF state, and the voltage of the signal output from the Q terminal also remains at S14. The voltage of the signal input to the G terminal of the second slave latch SL12 is in the ON state in this time period, and the voltage of the signal output from the Q terminal becomes equal to that of the signal output from the Q terminal of the second slave latch SL12, S12. The voltage of the signal input to the G terminal of the fourth master latch ML14 is also in the ON state, and the voltage of the signal output from the Q terminal becomes equal to that of the signal output from the Q terminal of the fourth master latch ML14, S14.

In a time period T10, the voltage of the scan test signal remains S23, the voltage CLK11 is in the ON state, the voltage CLK12 is in the OFF state, and the voltage CLK14 is in the OFF state.

In this time period, the voltage of the signal input to the G terminal of the first master latch ML11 is in the ON state, and the voltage of the signal output from the Q terminal is at S23. The voltage of the signal input from the G terminal of the second master latch ML12 is in the OFF state, and the voltage of the signal output from the Q terminal remains at S12. The voltage of the signal input to the G terminal of the third master latch ML13 is also in the ON state, and the voltage of the signal output from the Q terminal becomes equal to that of the signal output from the Q terminal of the second master latch ML12, S12. The voltage input to the G terminal of the fourth master latch ML14 is in the ON state, and the voltage of the signal output from the Q terminal also remains at S14.

In a time period T11, the voltage of the scan test signal remains S21, the voltage CLK11 is in the OFF state, and the voltage CLK12 is in the ON state.

In this time period, the voltage of the signal input to the G terminal of the first master latch ML11 is in the OFF state, and the voltage of the signal output from the Q terminal remains at S23. The voltage of the signal input from the G terminal of the second master latch ML12 is in the ON state, and the voltage of the signal output from the Q terminal becomes equal to that of the signal output from the Q terminal of the first master latch ML11, S23. The voltage of the signal input to the G terminal of the third master latch ML13 is in the OFF state, and the voltage of the signal output from the Q terminal remains S12. The voltage input to the G terminal of the fourth master latch ML14 is in the ON state, and the voltage of the signal output from the Q terminal also becomes equal to that of the signal output from the Q terminal of the third master latch ML13, S12.

In a time period T12, the voltage of the scan test signal remains S21, the voltage CLK11 is in the ON state, and the voltage CLK12 is in the OFF state.

In this time period, the voltage of the signal input to the G terminal of the first master latch ML11 is in the ON state, and the voltage of the signal output from the Q terminal remains at S21. The voltage of the signal input from the G terminal of the second master latch ML12 is in the OFF state, and the voltage of the signal output from the Q terminal remains S23. The voltage of the signal input to the G terminal of the third master latch ML13 is in the ON state, and the voltage of the signal output from the Q terminal becomes equal to that of the signal output from the Q terminal of the second master latch ML12, S23. The voltage input to the G terminal of the fourth master latch ML14 is in the OFF state, and the voltage of the signal output from the Q terminal remains S12.

In the time period T13, the voltages I1, I2, I3, and I4 are R1, R2, R3, and R4, respectively, the scan test signal is not input, CLK11, CLK12, and CLK14 are in the OFF state, and CLK13 is in the ON state. Note that the voltages I1 to I4 are kept the same in subsequent time periods. In this time period, the process is performed of switching SEL to the OFF state and switching the input signal of each selector.

In this time period, the voltage of the signal input to the G terminal of the first master latch ML11 is in the OFF state, and the voltage of the signal output from the Q terminal remains at S21. The voltage of the signal input from the G terminal of the second master latch ML12 is also in the OFF state, and the voltage of the signal output from the Q terminal remains at S23. The voltage of the signal input to the G terminal of the third master latch ML13 is in the OFF state, and the voltage of the signal output from the Q terminal remains at S23. The voltage input to the G terminal of the fourth master latch ML14 is in the OFF state, and the voltage of the signal output from the Q terminal remains S12. The voltage CLK13 is in the ON state, the voltage of the signal input to the G terminal of the first slave latch SL11 is in the ON state, and the voltage of the signal output from the Q terminal becomes equal to that of the signal output from the Q terminal of the third master latch ML13, S21. The voltage of the signal input to the G terminal of the third slave latch SL13 is in the ON state, the voltage of the signal output from the Q terminal becomes equal to that of the signal output from the Q terminal of the third master latch ML13, S23.

In a time period T14, the voltage CLK11 is in the ON state, the voltage CLK12 is in the OFF state, and the voltage SEL is in the ON state.

In this time period, the voltage SEL is in the OFF state, and the first selector MUX11 selects the signal input from the upstream-side logic circuit CKT11 and inputs it to the first master latch ML11. Since the voltage of the signal input to the G terminal in the first master latch ML11 is in the ON state, the voltage of the signal output from the Q terminal becomes equal to the voltage I1 input from the upstream-side logic circuit CKT11, R1. The voltage input to the G terminal of the second master latch ML12 is in the OFF state, and the voltage input from the Q terminal remains at S23. In the third master latch ML13, since the signal output from the upstream-side logic circuit CKT11 is input to the third master latch due to the OFF state of the voltage SEL, and the voltage of the signal input to the G terminal of the third master latch ML13 is in the ON state, the voltage of the signal output from the Q terminal of the third master latch ML13 becomes R3. Note that the voltage of the signal input from the G terminal of the fourth master latch ML14 is in the OFF state, and the voltage of the signal output from the Q terminal remains at S12. Note that since CLK13 remains in the OFF state, the voltage of the signal output from the Q terminal of the first slave latch remains at S21, and that of the signal output from the Q terminal of the third slave latch remains at S23.

In a time period T15, the voltage CLK11 is in the OFF state, and the voltage CLK12 is in the ON state.

In this time period, the voltage of the signal input to the G terminal of the first master latch ML11 is in the OFF state, and the voltage of the signal output from the Q terminal remains at R1. The voltage of the signal input to the G terminal of the second master latch ML12 is in the ON state, and the output from the Q terminal becomes equal to the voltage of the signal output from the Q terminal of the first master latch, R1. The voltage input to the G terminal of the third master latch ML13 is in the OFF state, and the voltage of the signal output from the Q terminal remains at R3. The voltage of the signal input to the G terminal of the fourth master latch ML14 is in the ON state, and the voltage of the signal output from the Q terminal becomes equal to the signal output from the Q terminal of the third master latch ML13, R3. Note that the voltage of the signal output from the first slave latch SL11 remains at S21, that of the signal output from the second slave latch SL12 remains at S12, that of the signal output from the third slave latch SL13 remains at S23, and that of the signal output from the fourth slave latch SL14 remains at S14.

In a time period T16, the voltage CLK11 is in the ON state, and the voltage CLK12 is in the OFF state.

In this time period, although the voltage of the signal input to the G terminal of the first master latch ML11 is in the ON state, since the scan test signal is not input, there is no input from the Q terminal. The voltage of the signal input to the G terminal of the second master latch ML12 is in the OFF state, and the voltage of the signal output from the Q terminal remains at R1. The voltage of the signal input to the G terminal of the third master latch ML13 is in the ON state, and the voltage of the signal output from the Q terminal becomes equal to that of the signal output from the Q terminal of the second master latch ML12, R1. The voltage of the signal input to the G terminal of the fourth master latch ML14 is in the OFF state, and the voltage of the signal output from the Q terminal remains at R3. Note that the voltage of the signal output from the first slave latch SL11 remains at S21, that of the signal output from the second slave latch SL12 remains at S12, that of the signal output from the third slave latch SL13 remains at S23, and that of the signal output from the fourth slave latch SL14 remains at S14.

In a time period T17, the voltage CLK11 is in the OFF state, and the voltage CLK12 is in the ON state.

In this time period, the voltage of the signal input to the G terminal of the first master latch ML11 is in the OFF state, and the state is kept in which there is no voltage for a signal output from the Q terminal. Although the voltage of the signal input to the G terminal of the second master latch is in the ON state, since there is no signal output from the Q terminal of the first master latch ML11, there is no voltage for a signal output from the Q terminal. The voltage of the signal input to the G terminal of the third master latch ML13 is in the OFF state, and the voltage of the signal output from the Q terminal is kept at R1. The voltage of the signal input to the G terminal of the fourth master latch ML14 is in the ON state, and the voltage of the signal output from the Q terminal becomes equal to that of the signal output from the Q terminal of the third master latch ML13, R1.

In a time period T18, the voltage CLK11 is in the ON state, and the voltage CLK12 is in the OFF state.

In this time period, the first master latch ML11 and second master latch ML12 remain unchanged from the time period T17. The voltage of the signal input to the G terminal of the third master latch ML13 is in the ON state, and a signal output from the Q terminal has a voltage equal to the voltage of a signal output from the Q terminal of the second master latch ML12. However, since there is no voltage output from the Q terminal of the second master latch ML12, there is no voltage for a signal output from the Q terminal. The G terminal of the fourth master latch ML14 is in the OFF state, and the voltage of the signal output from the Q terminal keeps the value R1.

As described above, it is possible to input a scan test signal, clock signal, and the like to a semiconductor integrated circuit, detect whether a resultant signal is analogous to a predicted signal calculated in advance, and process the semiconductor integrated circuit as a within-spec one if the detection result is within a predictable range and as an out-of-spec one if the detection result is outside the predictable range. Note that in this inspection, it is possible to repeat a test by repeatedly inputting a scan test signal, clock signal, and the like applied as described above and repeat a pattern test.

As has been described above, with the semiconductor integrated circuit according to this embodiment, it is possible to provide a semiconductor integrated circuit capable of easily performing both a one-pattern test and a two-pattern test without increasing the circuit area.

Although a case has been described in this embodiment for illustrative purposes where there are four flip-flops, the number of flip-flops may be four or more. In this case, selectors are provided corresponding in number to the flip-flops.

Second Embodiment

Figure 5:
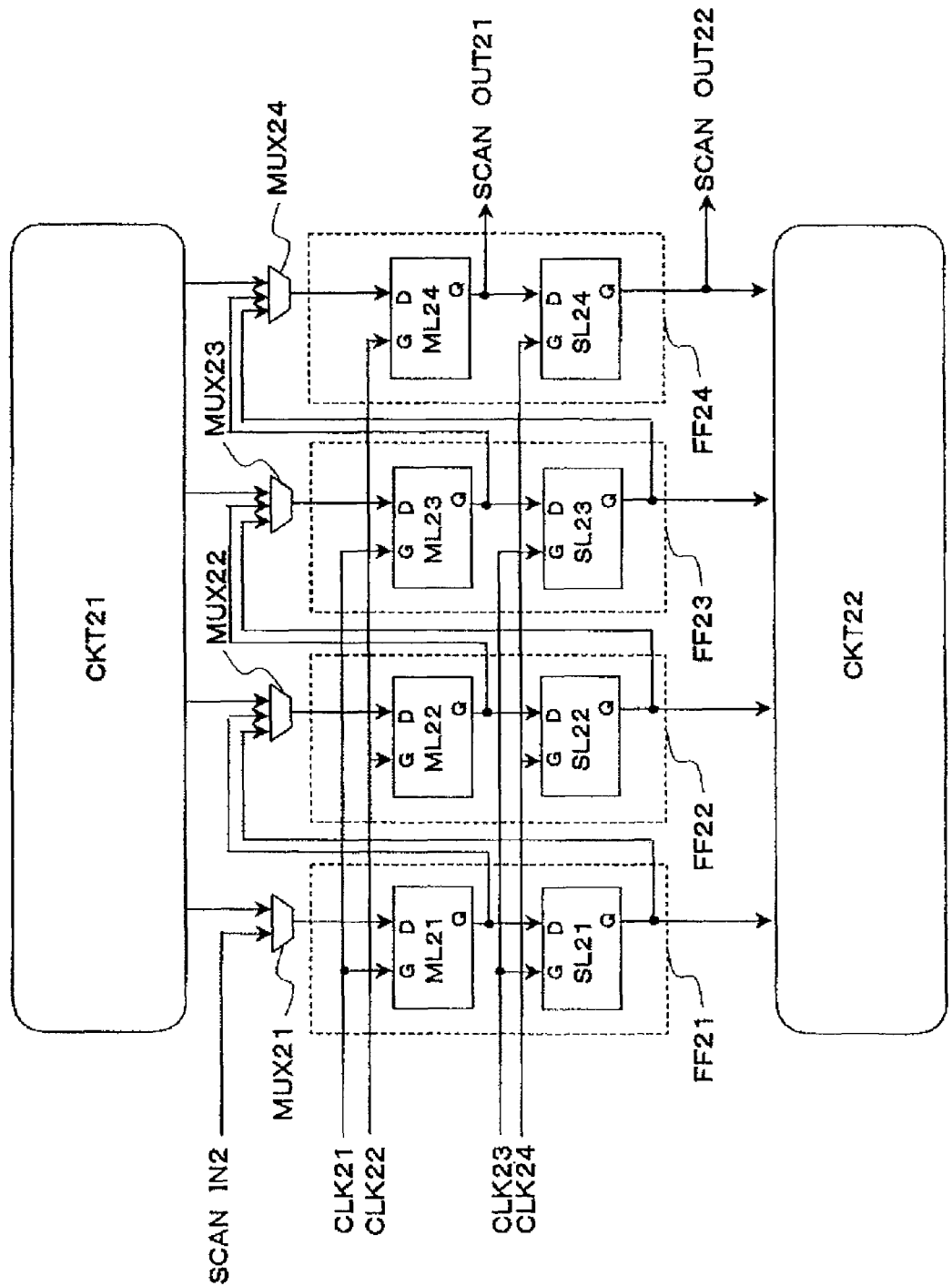
FIG. 5 is a block diagram of a semiconductor integrated circuit according to a second embodiment.

A second embodiment of the present invention will be described next with reference to the drawings. First, FIG. 5 shows a block diagram of a semiconductor integrated circuit according to this embodiment.

The configuration of the semiconductor integrated circuit according to this embodiment is almost the same as that of the first embodiment except that each selector has an input terminal provided to accept an output from a slave latch of a flip-flop different from a flip-flop corresponding to the selector and is electrically connectable to the slave latch and that an input terminal is formed to branch off such that a scan test signal output can be detected also on the side of a Q terminal of a fourth slave latch. More specifically, although the basic configuration of this embodiment is the same as that described in the first embodiment, a second selector MUX22 which is provided corresponding to a second flip-flop has three input terminals, and the additional one is electrically connectable to a Q terminal of a first slave latch in a first flip-flop. The same applies to a third selector MUX23. Note that although this embodiment adopts an aspect in which each selector has three input terminals, a plurality of selectors, each having two input terminals, may be connected such that one out of three inputs is practically output (in this case, the number of voltages SEL, each of which controls selection in a corresponding selector, needs to be equal to that of selectors provided).

The operation in the inspection on the semiconductor integrated circuit according to this embodiment (hereinafter simply referred to as "this inspection") will be described next. Although this inspection can be performed at various times, a mode in which this inspection is performed, e.g., before shipment of a semiconductor integrated circuit after formation of the semiconductor integrated circuit can be said to be the most preferable one.

Figure 6:
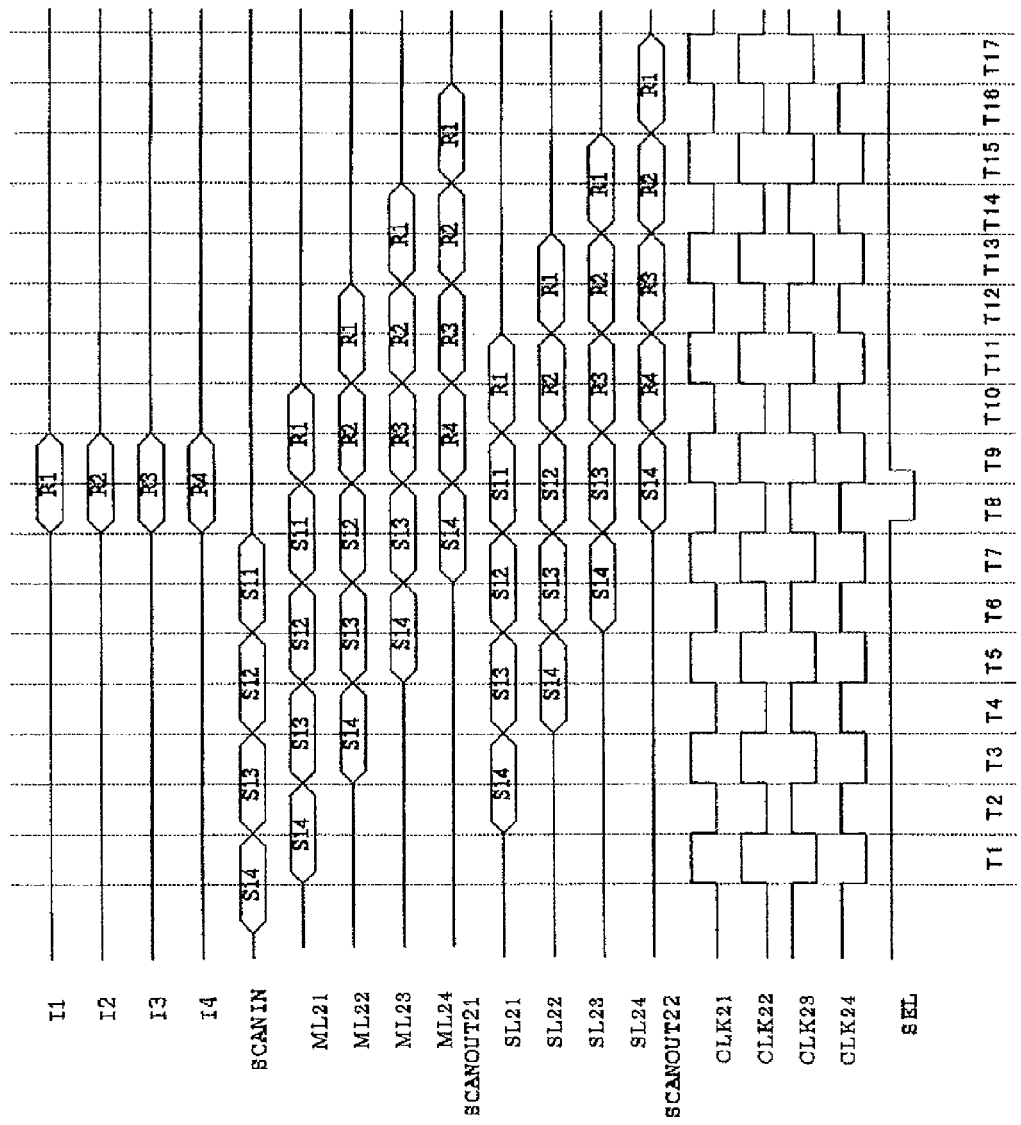
FIG. 6 is a chart showing the signal voltages of components in a one-pattern test for the semiconductor integrated circuit according to the second embodiment.

The semiconductor integrated circuit according to this embodiment can perform two kinds of inspections, a one-pattern test and a two-pattern test. FIG. 6 is a chart for explaining the relationship among signals in the one-pattern test. Reference characters I1, I2, . . . are almost the same as those in FIG. 3. Note that since an output from a fourth slave latch SL14 also serves as the scan test signal output, SL24 and SCANOUT2 are redundantly described.

In this inspection, a selector MUX21, the selectors MUX22 and MUX23, and a selector MUX24 are each configured to input an input from any of three input terminals to a master latch of a corresponding flip-flop by a connected power supply (not shown).

First, in a time period T1 in FIG. 6, a voltage SCAN IN of a scan test signal is S14, voltages CLK21 and CLK22 are in the ON state, and voltages CLK23 and CLK24 are in the OFF state. Note that the voltage SEL is in the ON state except in time periods T8 and T9 (to be described later), and except in these time periods, each selector except for the first selector MUX21 is configured to input an output from a Q terminal of a connected slave latch to a D terminal of a corresponding master latch while the first selector MUX21 is configured to select the scan test signal.

In this time period, the voltage of the signal input to the G terminal of the first master latch ML21 is in the ON state, and the voltage of the signal output from the Q terminal is at S14.

In a time period T2, the voltage of the scan test signal remains S13, the voltage CLK21 is in the OFF state, the voltage CLK22 is in the OFF state, the voltage CLK23 is in the ON state, and the voltage CLK24 is in the ON state.

In this time period, the voltage of the signal input to the G terminal of the first master latch ML21 is in the OFF state, the voltage of the signal output from the Q terminal remains at S14. The voltage of the signal input to the G terminal of the first slave latch SL21 is in the ON state, the voltage of the signal output from the Q terminal becomes equal to that of the signal output from the Q terminal of the first master latch ML21, S14.

In a time period T3, the voltage of the scan test signal remains at S13, the voltage CLK21 is in the ON state, the voltage CLK22 is in the ON state, the voltage CLK23 is in the OFF state, and the voltage CLK24 is in the OFF state.

In this time period, the voltage of the signal input to the G terminal of the first master latch ML21 is in the ON state, the voltage of the signal output from the Q terminal becomes equal to that of the voltage the scan test signal, S13. The voltage of the signal input to the G terminal of the slave latch SL12 is in the OFF state, the voltage of the signal output from the Q terminal remains at S14. The voltage of the signal input to the G terminal of the second master latch ML22 is in the ON state, the voltage of the signal output from the Q terminal becomes equal to that of the voltage the first slave latch SL21, S14.

In a time period T4, the voltage of the scan test signal remains S12, the voltage CLK21 is in the OFF state, the voltage CLK22 is in the OFF state, the voltage CLK23 is in the ON state, and the voltage CLK24 is in the ON state.

In this time period, the voltage of the signal input to the G terminal of the first master latch ML21 is in the OFF state, the voltage of the signal output from the Q terminal remains at S13. The voltage of the signal input to the G terminal of the first slave latch SL21 is in the ON state, the voltage of the signal output from the Q terminal becomes equal to that of the signal output from the Q terminal of the first master latch ML21, S13. The voltage of the signal input to the G terminal of the second master latch ML22 is in the OFF state, the voltage of the signal output from the Q terminal remains at S14. The voltage of the signal input to the G terminal of the second slave latch SL22 is in the ON state, the voltage of the signal output from the Q terminal becomes equal to that of the signal output from the Q terminal of the second master latch ML22, S14.

In a time period T5, the voltage of the scan test signal remains at S12, the voltage CLK21 is in the ON state, the voltage CLK22 is in the ON state, the voltage CLK23 is in the OFF state, and the voltage CLK24 is in the OFF state.

In this time period, the voltage of the signal input to the G terminal of the first master latch ML21 is in the ON state, the voltage of the signal output from the Q terminal become equal to that of the scan test signal, S12. The voltage of the signal input to the G terminal of the first slave latch SL21 is in the OFF state, the voltage of the signal output from the Q terminal remains at S13. The voltage of the signal input to the G terminal of the second master latch ML22 is in the ON state, the voltage of the signal output from the Q terminal becomes equal to that of the signal output from the Q terminal of the first slave latch SL21, S13. The voltage of the signal input to the G terminal of the second slave latch SL22 is in the OFF state, the voltage of the signal output from the Q terminal remains at S14. The voltage of the signal input to the G terminal of the third master latch ML23 is in the ON state, the voltage of the signal output from the Q terminal becomes equal to that of the signal output from the Q terminal of the second slave latch SL22, S14.

In a time period T6, the voltage of the scan test signal remains at S11, the voltage CLK21 is in the OFF state, the voltage CLK22 is in the OFF state, the voltage CLK23 is in the ON state, and the voltage CLK24 is in the ON state.

In this time period, the voltage of the signal input to the G terminal of the first master latch ML21 is in the OFF state, the voltage of the signal output from the Q terminal remains at S12. The voltage of the signal input to the G terminal of the first slave latch SL21 is in the ON state, the voltage of the signal output from the Q terminal becomes equal to that of the signal output from the Q terminal of the first master latch ML21, S12. The voltage of the signal input to the G terminal of the second master latch ML22 is in the OFF state, the voltage of the signal output from the Q terminal remains at S13. The voltage of the signal input to the G terminal of the second slave latch SL22 is in the ON state, the voltage of the signal output from the Q terminal becomes equal to that of the signal output from the Q terminal of the second master latch ML22, S13. The voltage of the signal input to the G terminal of the third master latch ML23 is in the OFF state, the voltage of the signal output from the Q terminal remains at S14. The voltage of the signal input to the G terminal of the third slave latch SL23 is in the ON state, the voltage of the signal output from the Q terminal becomes equal to that of the signal output from the Q terminal of the third master latch ML23, S14.

In a time period T7, the voltage of the scan test signal remains at S11, the voltage CLK21 is in the ON state, the voltage CLK22 is in the ON state, the voltage CLK23 is in the OFF state, and the voltage CLK24 is in the OFF state.

In this time period, the voltage of the signal input to the G terminal of the first master latch ML21 is in the ON state, the voltage of the signal output from the Q terminal becomes equal to that of the scan test signal, S11. The voltage of the signal input to the G terminal of the first slave latch SL21 is in the OFF state, the voltage of the signal output from the Q terminal remains at S12. The voltage of the signal input to the G terminal of the second master latch ML22 is in the ON state, the voltage of the signal output from the Q terminal becomes equal to that of the signal output from the Q terminal of the first slave latch SL21, S12. The voltage of the signal input to the G terminal of the second slave latch SL22 is in the OFF state, the voltage of the signal output from the Q terminal remains at S13. The voltage of the signal input to the G terminal of the third master latch ML23 is in the ON state, the voltage of the signal output from the Q terminal becomes equal to that of the signal output from the Q terminal of the second slave latch SL22, S13. The voltage of the signal input to the G terminal of the third slave latch SL23 is in the OFF state, the voltage of the signal output from the Q terminal remains at S14.

In a time period T8, the scan test signal is not input (After this time period, it is the same), the input voltage I1 is R1, the input voltage I2 is R2, the input voltage I3 is R3, and the input voltage I4 is R4. The voltage CLK21 is in the OFF state, the voltage CLK22 is in the OFF state, the voltage CLK23 is in the ON state, and the voltage of CLK24 is in ON state.

In this time period, the voltage of the signal input to the G terminal of the first master latch ML21 is in the OFF state, the voltage of the signal output from the Q terminal remains at S11. The voltage of the signal input to the G terminal of the first slave latch SL21 is in the ON state, the voltage of the signal output from the Q terminal becomes equal to that of the signal output from the Q terminal of the first master latch ML21, S11. The voltage of the signal input to the G terminal of the second master latch ML22 is in the OFF state, the voltage of the signal output from the Q terminal remains at S12. The voltage of the signal input to the G terminal of the second slave latch SL22 is in the ON state, the voltage of the signal output from the Q terminal becomes equal to that of the signal output from the Q terminal of the second master latch ML22, S12. The voltage of the signal input to the G terminal of the third master latch ML23 is in the OFF state, the voltage of the signal output from the Q terminal remains at S13. The voltage of the signal input to the G terminal of the third slave latch SL23 is in the ON state, the voltage of the signal output from the Q terminal becomes equal to that of the signal output from the Q terminal of the third master latch ML23, S13. The voltage of the signal input to the G terminal of the fourth master latch ML24 is in the OFF state, the voltage of the signal output from the Q terminal remains at S14. The voltage of the signal input to the G terminal of the fourth slave latch SL24 is in the ON state, the voltage of the signal output from the Q terminal becomes equal to that of the signal output from the Q terminal of the fourth master latch ML24, S14.

In a time period T9, the input voltage I1 remains at R1, the input voltage I2 remains at R2, the input voltage I3 remains at R3, and the input voltage I4 remains at R4. The voltage CLK21 is in the ON state, the voltage CLK22 is in the ON state, the voltage CLK23 is in the OFF state, and the voltage of CLK24 is in OFF state. Each selector has set been set to select the signal voltage from the upstream logic circuit CKT21.

The voltage of the signal input to the G terminal of the first master latch ML21 is in the ON state. As the selector selects the input signal differ from the scan test signal from the upstream logic circuit, the voltage of the signal output from the Q terminal is R1. The voltage of the signal input to the G terminal of the first slave latch SL21 is in the OFF state, the voltage of the signal output from the Q terminal remains at S11. The voltage of the signal input to the G terminal of the second master latch ML22 is in the ON state, the voltage of the signal output from the Q terminal becomes equal to that of the signal input from the upstream logic circuit CKT21, R2. The voltage of the signal input to the G terminal of the second slave latch SL22 is in the OFF state, the voltage of the signal output from the Q terminal remains S12. The voltage of the signal input to the G terminal of the third master latch ML23 is in the ON state, the voltage of the signal output from the Q terminal becomes equal to that of the signal input from the upstream logic circuit CKT21, R3. The voltage of the signal input to the G terminal of the third slave latch SL23 is in the OFF state, the voltage of the signal output from the Q terminal remains at S13. The voltage of the signal input to the G terminal of the fourth master latch ML24 is in the ON state, the voltage of the signal output from the Q terminal becomes equal to that of the signal input from the upstream logic circuit CKT21, R4. The voltage of the signal input to the G terminal of the fourth slave latch SL24 is in the OFF state, the voltage of the signal output from the Q terminal remains at S14. In this time period, the voltage SEL backs to OFF state, and the selector selects the scan test signal or the signal from the slave latch from the upstream logic circuit except the upstream logic circuit CKT21.

In a time period T10, the input voltage I1, I2, I3 and I4 are not input, The voltage CLK21 is in the OFF state, the voltage CLK22 is in the OFF state, the voltage CLK23 is in the ON state, and the voltage of CLK24 is in ON state.

In this time period, the voltage of the signal input to the G terminal of the first master latch ML21 is in the OFF state, the voltage of the signal output from the Q terminal remains at R1. The voltage of the signal input to the G terminal of the first slave latch SL21 is in the ON state, the voltage of the signal output from the Q terminal becomes equal to that of the signal output from the first master latch ML21, R1.

The voltage of the signal input to the G terminal of the second master latch ML22 is in the OFF state, the voltage of the signal output from the Q terminal remains at R2. The voltage of the signal input to the G terminal of the second slave latch SL22 is in the ON state, the voltage of the signal output from the Q terminal becomes equal to that of the signal output from the second master latch ML22, R2. The voltage of the signal input to the G terminal of the third master latch SL23 is in the OFF state, the voltage of the signal output from the Q terminal remains at R13. The voltage of the signal input to the G terminal of the third slave latch SL23 is in the ON state, the voltage of the signal output from the Q terminal becomes equal to that of the signal output from the third master latch ML23, R3. The voltage of the signal input to the G terminal of the fourth master latch ML24 is in the OFF state, the voltage of the signal output from the Q terminal remains at R4. The voltage of the signal input to the G terminal of the fourth slave latch SL24 is in the ON state, the voltage of the signal output from the Q terminal becomes equal to that of the signal output from the fourth master latch ML24, R4.

In a time period T11, the voltage CLK21 is in the ON state, the voltage CLK22 is in the ON state, the voltage CLK23 is in the OFF state, and the voltage of CLK24 is in OFF state.

In this time period, the voltage of the signal input to the G terminal of the first master latch ML21 is in the ON state, the voltage of the signal output from the Q terminal becomes equal to that of the scan test signal. But the scan test signal is not input, the signal output from the Q terminal is not output (hereafter it is the same). The voltage of the signal input to the G terminal of the first slave latch SL21 is in the OFF state, the voltage of the signal output from the Q terminal remains at R1. The voltage of the signal input to the G terminal of the second master latch ML22 is in the ON state, the voltage of the signal output from the Q terminal becomes equal to that of the signal output from the first slave latch SL21, R1. The voltage of the signal input to the G terminal of the second slave latch SL22 is in the OFF state, the voltage of the signal output from the Q terminal remains R2. The voltage of the signal input to the G terminal of the third master latch ML23 is in the ON state, the voltage of the signal output from the Q terminal becomes equal to that of the signal output from the second slave latch SL22, R2. The voltage of the signal input to the G terminal of the third slave latch SL23 is in the OFF state, the voltage of the signal output from the Q terminal remains at R3. The voltage of the signal input to the G terminal of the fourth master latch ML24 is in the ON state, the voltage of the signal output from the Q terminal becomes equal to that of the signal output from the third slave latch SL23, R3. The voltage of the signal input to the G terminal of the fourth slave latch SL24 is in the OFF state, the voltage of the signal output from the Q terminal remains at R4.

In a time period T12, the voltage CLK21 is in the OFF state, the voltage CLK22 is in the OFF state, the voltage CLK23 is in the ON state, and the voltage of CLK24 is in ON state.

The voltage of the signal input to the G terminal of the first slave latch SL21 is in the ON state, the voltage of the signal output from the Q terminal becomes equal to that of the signal output from the first master latch ML23. But the signal output from the Q terminal of the first master latch ML21 is not output, the signal output from the Q terminal of the first slave latch SL21 is not input (hereafter it is the same). The voltage of the signal input to the G terminal of the second master latch ML22 is in the OFF state, the voltage of the signal output from the Q terminal retain at R1. The voltage of the signal input to the G terminal of the second slave latch SL22 is in the ON state, the voltage of the signal output from the Q terminal becomes equal to that of the signal output from the second master latch ML22, R1. The voltage of the signal input to the G terminal of the third master latch ML23 is in the OFF state, the voltage of the signal output from the Q terminal remains at R2. The voltage of the signal input to the G terminal of the third slave latch SL23 is in the ON state, the voltage of the signal output from the Q terminal becomes equal to that of the signal output from the third master latch ML23, R2. The voltage of the signal input to the G terminal of the fourth master latch SL24 is in the OFF state, the voltage of the signal output from the Q terminal remains at R3. The voltage of the signal input to the G terminal of the fourth slave latch SL24 is in the ON state, the voltage of the signal output from the Q terminal becomes equal to that of the signal output from the fourth master latch ML24, R3.

In a time period T13, the voltage CLK21 is in the ON state, the voltage CLK22 is in the ON state, the voltage CLK23 is in the OFF state, and the voltage of CLK24 is in OFF state.

In this time period, the voltage of the signal input to the G terminal of the second master latch ML22 is in the ON state, the voltage of the signal output from the Q terminal becomes equal to that of the signal output from the first slave latch SL21. But the signal output from the Q terminal of the first slave latch SL21 is not output, the signal output from the Q terminal of the second master latch ML22 is not input. The voltage of the signal input to the G terminal of the second slave latch SL22 is in the OFF state, the voltage of the signal output from the Q terminal remains at R1. The voltage of the signal input to the G terminal of the third master latch SL23 is in the ON state, the voltage of the signal output from the Q terminal becomes equal to that of the signal output from the second slave latch SL22, R1. The voltage of the signal input to the G terminal of the third slave latch SL23 is in the OFF state, the voltage of the signal output from the Q terminal remains at R2. The voltage of the signal input to the G terminal of the fourth master latch ML24 is in the ON state, the voltage of the signal output from the Q terminal becomes equal to that of the signal output from the third slave latch SL23, R2. The voltage of the signal input to the G terminal of the fourth slave latch SL24 is in the OFF state, the voltage of the signal output from the Q terminal remains at R3.

In a time period T14, the voltage CLK21 is in the OFF state, the voltage CLK22 is in the OFF state, the voltage CLK23 is in the ON state, and the voltage of CLK24 is in ON state.

In this time period, the voltage of the signal input to the G terminal of the second slave latch SL22 is in the ON state, the voltage of the signal output from the Q terminal becomes equal to that of the signal output from the second master latch ML22. But the signal output from the Q terminal of the second master latch ML22 is not output, the signal output from the Q terminal of the second slave latch SL22 is not input. The voltage of the signal input to the G terminal of the third master latch ML23 is in the OFF state, the voltage of the signal output from the Q terminal remains at R10. The voltage of the signal input to the G terminal of the third slave latch SL23 is in the ON state, the voltage of the signal output from the Q terminal is R1. The voltage of the signal input to the G terminal of the fourth master latch ML24 is in the OFF state, the voltage of the signal output from the Q terminal remains at R2. The voltage of the signal input to the G terminal of the fourth slave latch SL24 is in the ON state, the voltage of the signal output from the Q terminal becomes equal to that of the signal output from the fourth master latch ML24, R2.

In a time period T15, the voltage CLK21 is in the ON state, the voltage CLK22 is in the ON state, the voltage CLK23 is in the OFF state, and the voltage of CLK24 is in OFF state.

In this time period, the voltage of the signal input to the G terminal of the third master latch ML23 is in the ON state, the voltage of the signal output from the Q terminal becomes equal to that of the signal output from the second slave latch SL22. But the signal output from the Q terminal of the second slave latch SL22 is not output, the signal output from the Q terminal of the third master latch ML23 is not input. The voltage of the signal input to the G terminal of the third slave latch SL23 is in the OFF state, the voltage of the signal output from the Q terminal remains at R1.

The voltage of the signal input to the G terminal of the fourth master latch ML24 is in the ON state, the voltage of the signal output from the Q terminal becomes equal to that of the signal output from the third slave latch SL23, R1. The voltage of the signal input to the G terminal of the fourth slave latch SL24 is in the OFF state, the voltage of the signal output from the Q terminal remains at R2.

In a time period T16, the voltage CLK21 is in the OFF state, the voltage CLK22 is in the OFF state, the voltage CLK23 is in the ON state, and the voltage of CLK24 is in ON state.

In this time period, the voltage of the signal input to the G terminal of the third slave latch SL23 is in the ON state, the voltage of the signal output from the Q terminal becomes equal to that of the signal output from the third master latch ML23. But the signal output from the Q terminal of the third master latch ML23 is not output, the signal output from the Q terminal of the third slave latch SL23 is not input. The voltage of the signal input to the G terminal of the fourth master latch ML24 is in the OFF state, the voltage of the signal output from the Q terminal remains at R1. The voltage of the signal input to the G terminal of the fourth slave latch SL24 is in the ON state, the voltage of the signal output from the Q terminal becomes equal to that of the signal output from the fourth master latch SL24, R1.

In a time period T17, the voltage CLK21 is in the ON state, the voltage CLK22 is in the ON state, the voltage CLK23 is in the OFF state, and the voltage of CLK24 is in OFF state.

In this time period, the voltage of the signal input to the G terminal of the fourth master latch ML24 is in the ON state, the voltage of the signal output from the Q terminal becomes equal to that of the signal output from the third slave latch SL23. But the signal output from the Q terminal of the third slave latch SL23 is not output, the signal output from the Q terminal of the fourth master latch ML24 is not input. The voltage of the signal input to the G terminal of the fourth slave latch SL24 is in the OFF state, the voltage of the signal output from the Q terminal remains at R1.

As described above, it is possible to implement a one-pattern test by the semiconductor integrated circuit according to this embodiment.

The two-pattern test in the semiconductor integrated circuit according to this embodiment is performed next.

Figure 7:
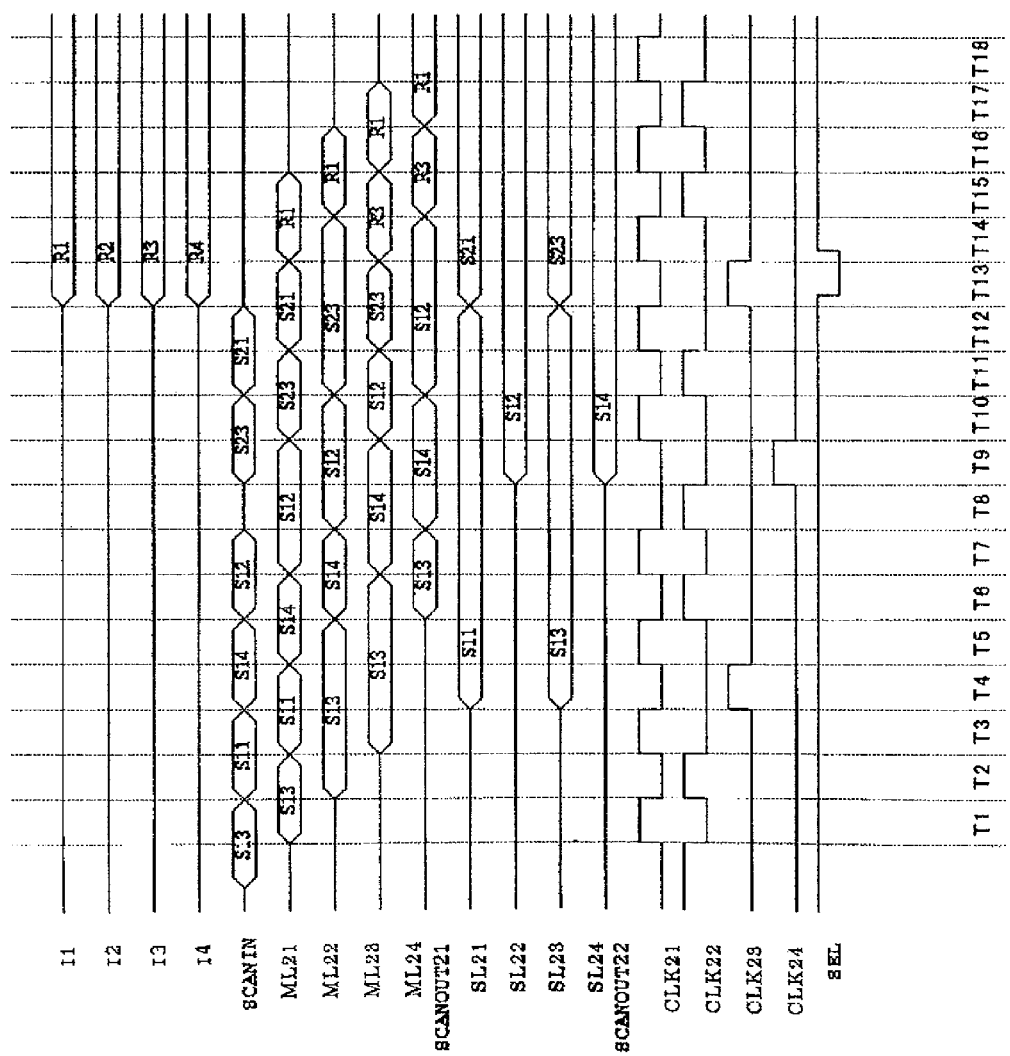
FIG. 7 is a chart showing the signal voltages of the components in a two-pattern test for the semiconductor integrated circuit according to the second embodiment.
Figure 8:
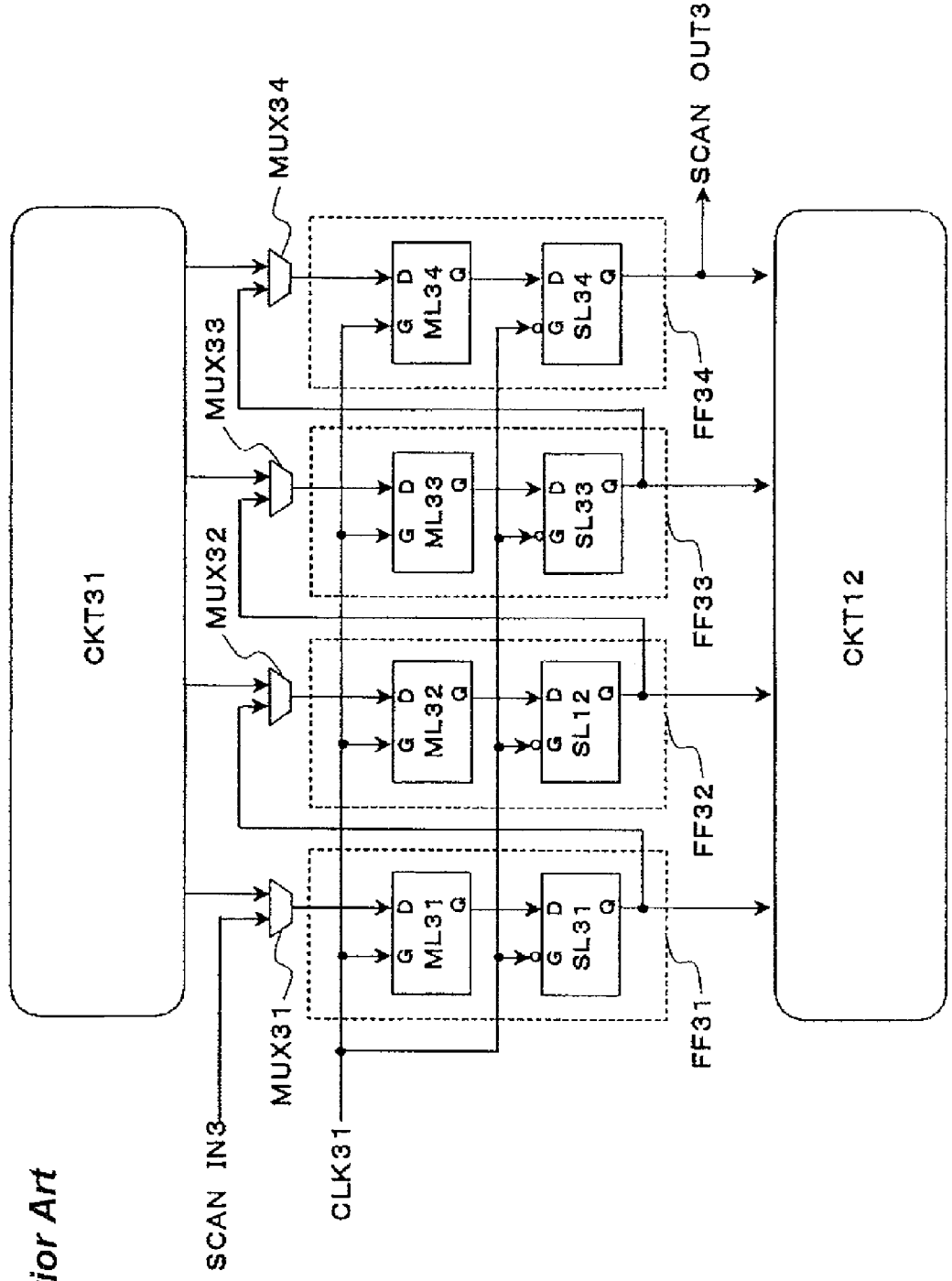
FIG. 8 is a block diagram of a semiconductor integrated circuit according to a first prior-art technique.
Figure 9:
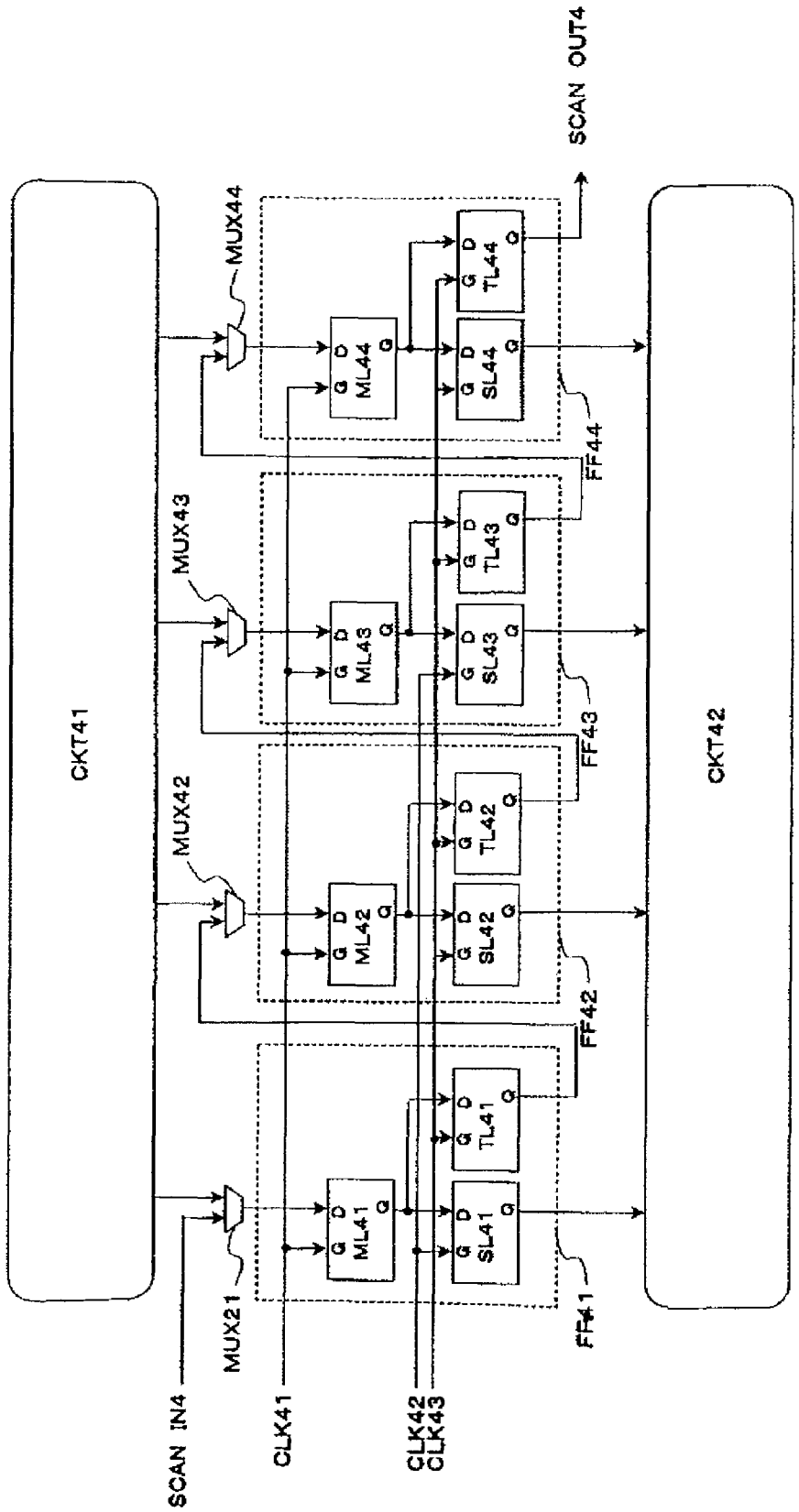
FIG. 9 is a block diagram of a semiconductor integrated circuit according to a second prior-art technique.

FIG. 7 is a chart for explaining the relationship among signals in the two-pattern test. Reference characters I1, I2, . . . are almost the same as those in FIG. 3. Note that since the output from the fourth slave latch SL24 also serves as the scan test signal output, SL24 and SCANOUT2 are redundantly described.

In this inspection, the selectors MUX21, MUX22, MUX23, and MUX24 are each configured to input the input from any of the three input terminals to the master latch of the corresponding flip-flop by the connected power supply (not shown). When SEL is in the ON state, the first selector MUX21 selects the scan test signal, and the second to fourth selectors MUX22, MUX23, and NUX24 each select a signal output from a Q terminal of a master latch which is different from the corresponding master latch.

First, in a time period T1 in FIG. 7, the voltage SCAN IN of the scan test signal is S13, the voltage CLK21 is in the ON state, the voltage CLK22 is in the OFF state, the voltage CLK23 is in the OFF state, and the voltage CLK24 is in the OFF state. Note that CLK23 is in the OFF state except in time periods T4 and T13, and CLK24 is in the OFF state except in a time period T9. The voltage SEL is in the ON state except in the time period T13, during which SEL is switched to the OFF state, and a time period T14 during which SEL is returned to the ON state.

In this time period, an input to a G terminal of a first master latch ML23 is in the ON state, and the voltage of a signal output from a Q terminal becomes S13.

In a time period T2, the voltage of the scan test signal is S11, the voltage CLK21 is in the OFF state, and the voltage CLK22 is in the ON state.

In this time period, the voltage of the signal input to the G terminal of the first master latch ML21 is in the OFF state, the voltage of the signal output from the Q terminal remains at S13. The voltage of the signal input to the G terminal of the first slave latch SL21 is in the ON state, the voltage of the signal output from the Q terminal becomes equal to that of the signal output from the first master latch ML21, S13.

In a time period T3, the voltage of the scan test signal remains at S11, the voltage CLK21 is in the ON state, and the voltage CLK22 is in the OFF state.

In this time period, the voltage of the signal input to the G terminal of the first master latch ML21 is in the ON state, the voltage of the signal output from the Q terminal becomes equal to that of the scan test signal, S11. The voltage of the signal input to the G terminal of the second master latch ML22 is in the OFF state, the voltage of the signal output from the Q terminal remains S13. The voltage of the signal input to the G terminal of the third master latch ML23 is in the ON state, the voltage of the signal output from the Q terminal becomes equal to that of the signal output from the second master latch ML22, S13.

In a time period T4, the voltage of the scan test signal is S14, the voltage CLK21 is in the OFF state, the voltage CLK22 is in the OFF state, and the voltage CLK23 is in the ON state.

In this time period, the voltage of the signal input to the G terminal of the first master latch ML21 is in the OFF state, the voltage of the signal output from the Q terminal remains at S11. The voltage of the signal input to the G terminal of the second master latch ML22 is in the OFF state, the voltage of the signal output from the Q terminal remains at S13. The voltage of the signal input to the G terminal of the third master latch ML23 is in the OFF state, the voltage of the signal output from the Q terminal remains at S13. The voltage of the signal input to the G terminal of the first slave latch SL21 is in the ON state, the voltage of the signal output from the Q terminal becomes equal to that of the signal output from the first master latch ML21, S11. The voltage of the signal input to the G terminal of the third slave latch SL23 is in the ON state, the voltage of the signal output from the Q terminal becomes equal to that of the signal output from the third master latch ML23, S13.

In a time period T5, the voltage of the scan test signal remains at S14, the voltage CLK21 is in the ON state, and the voltage CLK22 is in the OFF state.

In this time period, the voltage of the signal input to the G terminal of the first master latch ML21 is in the ON state, the voltage of the signal output from the Q terminal is S14. The voltage of the signal input to the G terminal of the second master latch ML22 is in the OFF state, the voltage of the signal output from the Q terminal remains at S13. The voltage of the signal input to the G terminal of the third master latch ML23 is in the ON state, the voltage of the signal output from the Q terminal becomes equal to that of the signal output from the second master latch ML22, S13. The signal output is same as the time period T4. The voltage of the signal input to the G terminal of the first slave latch SL21 is in the OFF state, the voltage of the signal output from the Q terminal remains at S11 (it is the same till the time period T12). The voltage of the signal input to the G terminal of the third slave latch SL23 is in the OFF state, the voltage of the signal output from the Q terminal remains at S13 (it is also the same till the time period T12).

In a time period T6, the voltage of the scan test signal is S12, the voltage CLK21 is in the OFF state, and the voltage CLK22 is in the ON state.

In this time period, the voltage of the signal input to the G terminal of the first master latch ML21 is in the OFF state, the voltage of the signal output from the Q terminal remains at S14. The voltage of the signal input to the G terminal of the second master latch ML22 is in the ON state, the voltage of the signal output from the Q terminal is S14. The voltage of the signal input to the G terminal of the third master latch ML23 is in the OFF state, the voltage of the signal output from the Q terminal remains at S13. The voltage of the signal input to the G terminal of the fourth master latch ML24 is in the ON state, the voltage of the signal output from the Q terminal becomes equal to that of the signal output from the third master latch ML23, S13.

In a time period T7, the voltage of the scan test signal remains at S11, the voltage CLK21 is in the ON state, and the voltage CLK22 is in the OFF state.

In this time period, the voltage of the signal input to the G terminal of the first master latch ML21 is in the ON state, the voltage of the signal output from the Q terminal becomes equal to that of the scan test signal, S12. The voltage of the signal input to the G terminal of the second master latch ML22 is in the OFF state, the voltage of the signal output from the Q terminal remains at S14. The voltage of the signal input to the G terminal of the third master latch ML23 is in the ON state, the voltage of the signal output from the Q terminal becomes equal to that of the signal output from the second master latch ML22, S14. The voltage of the signal input to the G terminal of the fourth master latch ML24 is in the OFF state, the voltage of the signal output from the Q terminal remains at S13.

In a time period T8, the scan test signal is not input, the voltage CLK21 is in the OFF state, and the voltage CLK22 is in the ON state.

In this time period, the voltage of the signal input to the G terminal of the first master latch ML21 is in the OFF state, the voltage of the signal output from the Q terminal remains at S12. The voltage of the signal input to the G terminal of the second master latch ML22 is in the OFF state, the voltage of the signal output from the Q terminal becomes equal to that of the signal output from the first master latch ML21, S12. The voltage of the signal input to the G terminal of the third master latch ML23 is in the OFF state, the voltage of the signal output from the Q terminal remains at S14. The voltage of the signal input to the G terminal of the fourth master latch ML24 is in the ON state, the voltage of the signal output from the Q terminal becomes equal to that of the signal output from the third master latch ML23, S14.

In a time period T9, the voltage of the scan test signal is S23, the voltage CLK21 is in the OFF state, the voltage CLK22 is in the OFF state, and the voltage CLK23 is in the ON state.

In this time period, the voltage of the signal input to the G terminal of the first master latch ML21 is in the OFF state, the voltage of the signal output from the Q terminal remains at S12. The voltage of the signal input to the G terminal of the second master latch ML22 is in the OFF state, the voltage of the signal output from the Q terminal remains at S12. The voltage of the signal input to the G terminal of the third master latch ML23 is in the OFF state, the voltage of the signal output from the Q terminal remains at S14. The voltage of the signal input to the G terminal of the fourth master latch ML24 is in the OFF state, the voltage of the signal output from the Q terminal remains at S14. The voltage of the signal input to the G terminal of the second slave latch SL22 is in the ON state, the voltage of the signal output from the Q terminal becomes equal to that of the signal output from the second master latch ML22, S12. The voltage of the signal input to the G terminal of the fourth slave latch SL24 is in the ON state, the voltage of the signal output from the Q terminal becomes equal to that of the signal output from the fourth master latch ML24, S14.

In a time period T10, the voltage of the scan test signal is S23, the voltage CLK21 is in the ON state, and the voltage CLK22 is in the OFF state.

In this time period, the voltage of the signal input to the G terminal of the first master latch ML21 is in the ON state, the voltage of the signal output from the Q terminal becomes equal to that of the scan test signal, S23. The voltage of the signal input to the G terminal of the second master latch ML22 is in the OFF state, the voltage of the signal output from the Q terminal remains at S12. The voltage of the signal input to the G terminal of the third master latch ML23 is in the ON state, the voltage of the signal output from the Q terminal becomes equal to that of the signal output from the second master latch ML22, S12. The voltage of the signal input to the G terminal of the fourth master latch ML24 is in the OFF state, the voltage of the signal output from the Q terminal remains at S14. The voltage of the signal input to the G terminal of the second slave latch SL22 is in the OFF state, the voltage of the signal output from the Q terminal remains at S12 (hereafter it is the same). The voltage of the signal input to the G terminal of the fourth slave latch SL24 is in the OFF state, the voltage of the signal output from the Q terminal remains at S14 (hereafter it is the same).

In a time period T11, the voltage of the scan test signal is S21, the voltage CLK21 is in the OFF state, and the voltage CLK22 is in the ON state.

In this time period, the voltage of the signal input to the G terminal of the first master latch ML21 is in the OFF state, the voltage of the signal output from the Q terminal remains at S23. The voltage of the signal input to the G terminal of the second master latch ML22 is in the ON state, the voltage of the signal output from the Q terminal becomes equal to that of the signal output from the first master latch ML21, S23. The voltage of the signal input to the G terminal of the third master latch ML23 is in the OFF state, the voltage of the signal output from the Q terminal remains at S12. The voltage of the signal input to the G terminal of the fourth master latch ML24 is in the ON state, the voltage of the signal output from the Q terminal becomes equal to that of the signal output from the third master latch ML23, S12.

In a time period T12, the voltage of the scan test signal remains at S21, the voltage CLK21 is in the ON state, and the voltage CLK22 is in the OFF state.

In this time period, the voltage of the signal input to the G terminal of the first master latch ML21 is in the ON state, the voltage of the signal output from the Q terminal becomes equal to that of the scan test signal, S21. The voltage of the signal input to the G terminal of the second master latch ML22 is in the OFF state, the voltage of the signal output from the Q terminal remains at S23. The voltage of the signal input to the G terminal of the third master latch ML23 is in the ON state, the voltage of the signal output from the Q terminal becomes equal to that of the signal output from the second master latch ML22, S23. The voltage of the signal input to the G terminal of the fourth master latch ML24 is in the OFF state, the voltage of the signal output from the Q terminal remains at S12.

In a time period T13, the scan test signal is not input (After this time period, it is the same). As a signal input from upstream logic circuit CKT21, I1 is R1, I2 is R2, I3 is R3, and I4 is R4 (hereafter it is the same). The voltage of CLK11 is in the OFF state, the voltage of CLK12 is in the OFF state, the voltage of CLK13 is in the ON state, and the voltage of CLK14 is in the OFF state. In this time period, the voltage of SEL is changed to the OFF state.

In this time period, the voltage of the signal input to the G terminal of the first master latch ML21 is in the OFF state, the voltage of the signal output from the Q terminal remains at S21. The voltage of the signal input to the G terminal of the second master latch ML22 is in the OFF state, the voltage of the signal output from the Q terminal remains at S23. The voltage of the signal input to the G terminal of the third master latch ML23 is in the OFF state, the voltage of the signal output from the Q terminal remains at S23. The voltage of the signal input to the G terminal of the fourth master latch ML24 is in the OFF state, the voltage of the signal output from the Q terminal remains S12. The voltage of the signal input to the G terminal of the first slave latch SL21 is in the ON state, the voltage of the signal output from the Q terminal becomes equal to that of the signal output from the first master latch ML21, S21. The voltage of the signal input to the G terminal of the third slave latch SL23 is in the ON state, the voltage of the signal output from the Q terminal becomes equal to that of the signal output from the third master latch ML23, S23.

In a time period T14, the voltage CLK21 is in the ON state, and the voltage CLK22 is in the OFF state. In this time period, the voltage of the SEL becomes the ON state again.

In this time period, the voltage of the signal input to the G terminal of the first master latch ML21 is in the ON state, the voltage of the signal output from the Q terminal becomes equal to that of the signal input from the upstream logic circuit CKT21, R1. The voltage of the signal input to the G terminal of the second master latch ML22 is in the OFF state, the voltage of the signal output from the Q terminal remains at S23. The voltage of the signal input to the G terminal of the third master latch ML23 is in the ON state, the voltage of the signal output from the Q terminal becomes equal to that of the signal input from the upstream logic circuit CKT21, R3. The voltage of the signal input to the G terminal of the fourth master latch ML24 is in the OFF state, the voltage of the signal output from the Q terminal remains at S12. The voltage of the signal input to the G terminal of the first slave latch SL21 is in the OFF state, the voltage of the signal output from the Q terminal remains at S21 (hereafter it is the same). The voltage of the signal input to the G terminal of the third slave latch SL23 is in the OFF state, the voltage of the signal output from the Q terminal remains at S23 (hereafter it is the same).

In a time period T15, the voltage CLK21 is in the OFF state, and the voltage CLK22 is in the ON state.

In this time period, the voltage of the signal input to the G terminal of the first master latch ML21 is in the OFF state, the voltage of the signal output from the Q terminal remains at R1. The voltage of the signal input to the G terminal of the second master latch ML22 is in the ON state, the voltage of the signal output from the Q terminal becomes equal to that of the signal output from the first master latch ML21, R1. The voltage of the signal input to the G terminal of the third master latch ML23 is in the OFF state, the voltage of the signal output from the Q terminal remains at R3. The voltage of the signal input to the G terminal of the fourth master latch ML24 is in the ON state, the voltage of the signal output from the Q terminal becomes equal to that of the signal output from the third master latch ML23, R3.

In a time period T16, the voltage CLK21 is in the ON state, and the voltage CLK22 is in the OFF state.

In this time period, the voltage of the signal input to the G terminal of the first master latch ML21 is in the ON state, the voltage of the signal output from the Q terminal becomes equal to that of the scan test signal. But the scan test signal is not input, the signal output from the Q terminal of the first master latch ML21 is not output (hereafter it is the same). The voltage of the signal input to the G terminal of the second master latch ML22 is in the OFF state, the voltage of the signal output from the Q terminal remains at R1. The voltage of the signal input to the G terminal of the third master latch ML23 is in the ON state, the voltage of the signal output from the Q terminal becomes equal to that of the signal output from the second master latch ML22, R1. The voltage of the signal input to the G terminal of the fourth master latch ML24 is in the OFF state, the voltage of the signal output from the Q terminal remains at R3.

In a time period T17, the voltage CLK21 is in the OFF state, and the voltage CLK22 is in the ON state.

In this time period, the voltage of the signal input to the G terminal of the second master latch ML22 is in the ON state, the voltage of the signal output from the Q terminal becomes equal to that of the scan test signal. But the scan test signal is not input, the signal output from the Q terminal of the second master latch ML22 is not output (hereafter it is the same). The voltage of the signal input to the G terminal of the third master latch ML23 is in the OFF state, the voltage of the signal output from the Q terminal remains at R1. The voltage of the signal input to the G terminal of the fourth master latch ML24 is in the ON state, the voltage of the signal output from the Q terminal becomes equal to that of the signal output from the third master latch ML23, R1.

In a time period T18, the voltage CLK21 is in the ON state, and the voltage CLK22 is in the OFF state.

In this time period, the voltage of the signal input to the G terminal of the third master latch ML23 is in the ON state, the voltage of the signal output from the Q terminal becomes equal to that of the scan test signal. But the scan test signal is not input, the signal output from the Q terminal of the third master latch ML23 is not output (hereafter it is the same). The voltage of the signal input to the G terminal of the fourth master latch ML24 is in the OFF state, the voltage of the signal output from the Q terminal remains at R1.

As has been described above, with the semiconductor integrated circuit according to this embodiment, it is possible to provide a semiconductor integrated circuit capable of easily performing both a one-pattern test and a two-pattern test without increasing the number of latches.

Note that the relationship among the voltages of the signals in the two-pattern test used in the second embodiment can also be used in the two-pattern test in the first embodiment, and the signals of the two-pattern test and one-pattern test used in the first embodiment can be applied to the two-pattern test and one-pattern test of the second embodiment as needed (provided that control of selection in each selector is adjusted).

The invention claimed is:

1. An integrated circuit comprising:
a plurality of flip-flops, each of the flip-flops comprising a master latch and a slave latch, the master latch including an output electrically connected to an input of the slave latch; and
a plurality of selectors, each of which includes an output electrically connected to an input of the master latch of a respective one of the flip-flops wherein at least one of the selectors includes an input connected to an output of the master latch of one of the flip-flops that are not electrically connected to the output of the at least one of the selectors, and wherein the at least one of the selectors further comprises another input connected to an output of the slave latch of the one of the flip-flops.

2. The integrated circuit according to claim 1, wherein the master latches of the plurality of flip-flops and the selectors together form a scan chain.

3. The integrated circuit according to claim 1, wherein the plurality of selectors comprise a first selector and a second selector, wherein the master latches of the flip-flops include a first master latch and a second master latch, the first master latch being configured to receive a signal from the first selector and a first clock signal and to provide a signal to the second selector, the second master latch being configured to receive a signal from the second selector and a second clock signal.

4. The integrated circuit according to claim 3, wherein the slave latches of the flip-flops include a first slave latch and a second slave latch, wherein the first slave latch is configured to receive a third clock signal and the signal provided to the second selector from the first master latch, and wherein the second slave latch is configured to receive a fourth clock signal and a signal from the second master latch.

5. An apparatus comprising:
a first logic circuit;
a plurality of selectors configured to receive signals from the first logic circuit;
a plurality of master latches, each of which is configured to receive a signal from a respective one of the selectors;
a plurality of slave latches, each of which is configured to receive a signal from a respective one of the master latches; and
a second logic circuit configured to receive signals from the slave latches,
wherein one of the plurality of selectors is configured to select one of a signal provided from outside the apparatus and a signal from the first logic circuit and to output the one of the signals to the master latch configured to receive a signal from the one of the selectors,
wherein at least one of the others of the selectors includes an input connected to an output of one of the master latches that are not electrically connected to an output of the at least one selector, and wherein the at least one of the others of the selectors further comprises another input connected to an output of the slave latch that is configured to receive a signal from the one of the master latches that are not electrically connected to the output of the at least one selector.

6. An integrated circuit comprising:
a plurality of flip-flops, each of the flip-flops comprising a master latch and a slave latch, the master latch including an output electrically connected to an input of the slave latch; and
a plurality of selectors, each of which includes an output electrically connected to an input of the master latch of a respective one of the flip-flops wherein at least one of the selectors includes an input connected to an output of the master latch of one of the flip-flops that are not electrically connected to the output of the at least one of the selectors,
wherein the plurality of selectors comprise a first selector and a second selector, wherein the master latches of the flip-flops include a first master latch and a second master latch, the first master latch being configured to receive a signal from the first selector and a first clock signal and to provide a signal to the second selector, the second master latch being configured to receive a signal from the second selector and a second clock signal,
wherein the slave latches of the flip-flops include a first slave latch and a second slave latch, wherein the first slave latch is configured to receive a third clock signal and the signal provided to the second selector from the first master latch, and wherein the second slave latch is configured to receive a fourth clock signal and a signal from the second master latch, and
wherein the first slave latch is further configured to provide a signal to the first selector, and wherein the second slave latch is configured to provide a signal to another of the selectors.

* * * * *